(12) United States Patent
Mauder et al.

(10) Patent No.: US 7,923,772 B2
(45) Date of Patent: Apr. 12, 2011

(54) SEMICONDUCTOR DEVICE WITH A SEMICONDUCTOR BODY AND METHOD FOR PRODUCING IT

(75) Inventors: Anton Mauder, Kolbermoor (DE); Hans-Joachim Schulze, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 461 days.

(21) Appl. No.: 12/112,710

(22) Filed: Apr. 30, 2008

(65) Prior Publication Data

US 2008/0265315 A1    Oct. 30, 2008

(30) Foreign Application Priority Data

Apr. 30, 2007  (DE) .................. 10 2007 020 657

(51) Int. Cl.
*H01L 29/78* (2006.01)
*H01L 21/336* (2006.01)
(52) U.S. Cl. ................................... 257/330
(58) Field of Classification Search .......... 257/330, 257/259, 270, 271, 589, E27.091, E27.095, 257/E29.2, E29.201, E29.257, E29.26, 214, 257/216, 302, 328, 331, E27.052, E27.079, 257/E29.036–E29.038, E29.046–E29.225, 257/E21.388; 438/197, 268, 270
See application file for complete search history.

(56) References Cited

U.S. PATENT DOCUMENTS

| | | | |
|---|---|---|---|
| 4,831,423 A | 5/1989 | Shannon | |
| 5,617,351 A * | 4/1997 | Bertin et al. | 365/185.05 |
| 7,745,878 B2 * | 6/2010 | Bhalla et al. | 257/330 |
| 2001/0028084 A1 * | 10/2001 | Mo | 257/330 |
| 2002/0195656 A1 * | 12/2002 | Hattori | 257/330 |
| 2005/0082591 A1 * | 4/2005 | Hirler et al. | 257/302 |
| 2005/0161746 A1 | 7/2005 | Mauder et al. | |
| 2006/0076613 A1 * | 4/2006 | Ohyanagi et al. | 257/330 |
| 2006/0267082 A1 * | 11/2006 | Hofmann et al. | 257/328 |
| 2008/0085586 A1 * | 4/2008 | Kobayashi | 438/270 |
| 2009/0008706 A1 * | 1/2009 | Yedinak et al. | 257/328 |
| 2010/0038710 A1 * | 2/2010 | Ohtani et al. | 257/330 |

FOREIGN PATENT DOCUMENTS

| | | |
|---|---|---|
| DE | 199 50 579 | 4/2008 |
| GB | 2 173 037 | 10/1986 |
| WO | 20050653585 | 7/2005 |

* cited by examiner

*Primary Examiner* — Dao H Nguyen
*Assistant Examiner* — Tram H Nguyen
(74) *Attorney, Agent, or Firm* — Dicke, Billig & Czaja, P.L.L.C.

(57) ABSTRACT

A semiconductor device with a semiconductor body and to a method for producing it. In one embodiment, the semiconductor body has first electrodes which contact first highly doped semiconductor zones and complementary-conduction body zones surrounding the first semiconductor zones. The semiconductor body has a second electrode which contacts a second highly doped semiconductor zone. Between the second semiconductor zone and the body zones, a drift zone is arranged. Control electrodes which are insulated from the semiconductor body by a gate oxide and act on the body zones for controlling the semiconductor device are arranged on the semiconductor body. The body zones have minority charge carrier injector zones with complementary conduction to the body zones, arranged between the first semiconductor zones and the drift zone.

24 Claims, 17 Drawing Sheets

SEMICONDUCTOR DEVICE WITH A SEMICONDUCTOR BODY AND METHOD FOR PRODUCING IT

CROSS-REFERENCE TO RELATED APPLICATIONS

This Utility Patent Application claims benefit of German Patent Application 10 2007 020 657.9, filed Apr. 30, 2007, incorporated herein.

BACKGROUND

The invention relates to a semiconductor component with a semiconductor body and to a method for producing it. For this purpose, the semiconductor body has first electrodes which contact first highly doped semiconductor zones and complementary-conduction body zones, surrounding the first semiconductor zones, in the semiconductor body. In addition, the semiconductor body has a second electrode which contacts a second highly doped semiconductor zone. Between the second semiconductor zone and the body zones, a drift zone is arranged. Furthermore, control electrodes are arranged on the semiconductor body which are insulated from the semiconductor body by a gate oxide and act on the body zones for controlling the semiconductor device.

During the driving of the semiconductor device, a dynamic avalanche effect or also a dynamic punch-through effect may occur at the main pn junction between body zone and drift zone, which have a negative effect on the semiconductor devices if, for example, the current caused by the dynamic avalanche or by the dynamic punch-through, respectively, is sufficiently large to drive the first highly doped zone into conduction. This is equivalent to a malfunction of the semiconductor device and may damage the semiconductor device or impair the EMC characteristic (Electromagnetic Compatibility characteristic).

Furthermore, field steepening can occur with an avalanche at the non-conducting main pn junction between the body zones and the drift zone and lead to high destructive avalanche current densities. In the case of semiconductor devices with trench gate electrodes, field steepening with avalanche can additionally lead to high avalanche current densities at the trench gate bottom and thus damage the semiconductor device. Structures which counteract this dynamic avalanche effect or also a dynamic punch-through effect at the non-conducting main pn junction between body zone and drift zone have hitherto not been known.

Furthermore, voltage peaks may occur during the cutting-off of semiconductor devices with a flooded body diode during the commutation process since the reverse current breaks severely during the cutting-off. Such an interruption is unwanted because this distinctly degrades the electromagnetic compatibility characteristic (EMC characteristic) of the semiconductor device in its application. In semiconductor devices, such a problem only occurs with nominal cut-off voltages above 70 volts, particularly above 150 volts. On the other hand, the background doping is so high at very low cut-off voltages that flooding of the low-doped region for accommodating the space charge zone in the cut-off case with electrons and holes scarcely occurs.

In addition, this problem of interruption of the reverse current during cutting-off occurs when during a diode operation of the semiconductor device, the channel which forms between the first highly doped semiconductor zone and the drift zone in the body zone cannot remain connected for the entire period because cut-off loading can occur at the semiconductor device, for example with a direct transition from the conducting body diode.

To counteract this effect, a pedestal zone with correspondingly great thickness and correspondingly lesser doping compared with the drift zone has hitherto been used in between the drift zone and the second highly doped semiconductor zone in such semiconductor devices so that such a current interruption is avoided and a gradual switching characteristic is achieved which is tolerable in the EMC characteristic. However, such a high-resistance, because low-doped pedestals are in between drift zone and second highly doped semiconductor zone increases the resistive conducting-state losses of a semiconductor device switching in such gradual manner.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment relates to a semiconductor device with a semiconductor body and to a method for producing it. For this purpose, the semiconductor body has first electrodes which contact first highly doped semiconductor zones and complementary-conduction body zones surrounding the first semiconductor zones. In addition, the semiconductor body has a second electrode which contacts a second highly doped semiconductor zone. Between the second semiconductor zone and the body zones, a drift zone is arranged. Furthermore, control electrodes are provided on the semiconductor body which are insulated from the semiconductor body by a gate oxide and act on the body zones for controlling the semiconductor device. In addition, the body zones have minority charge carrier injector zones with complementary conduction to the body zones, arranged between the first semiconductor zones and the drift zone. As an alternative or supplement, the drift zones have injector zones doped complementarily to the drift zone in the vicinity of the second highly doped zone.

Figure 1:
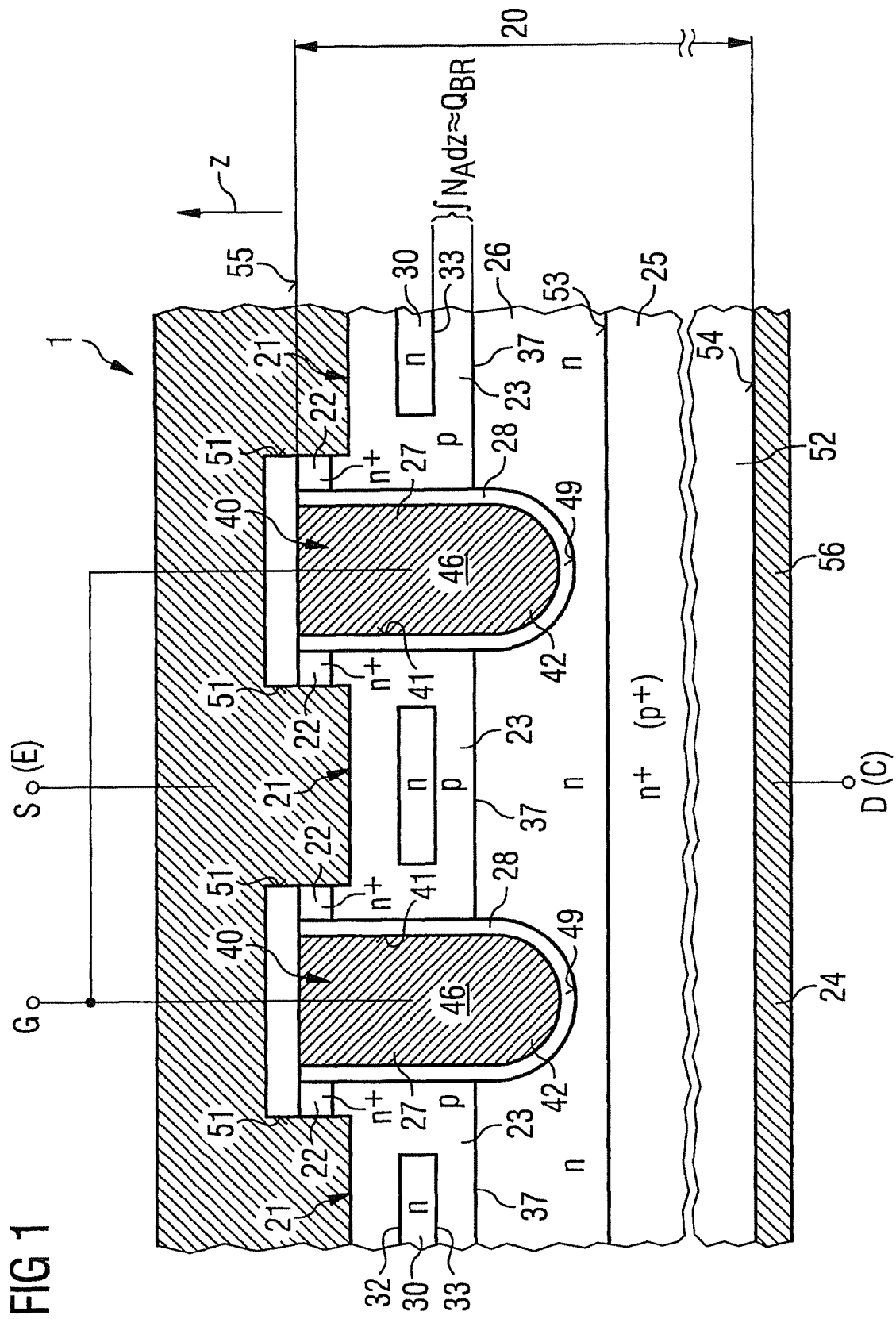
FIG. 1 illustrates a diagrammatic cross section through a semiconductor device according to one embodiment.

FIG. 1 illustrates a diagrammatic cross section through a semiconductor device 1 with a semiconductor body 20 according to a first embodiment. In this arrangement, the semiconductor body 20 has first electrodes 21 which contact first highly doped semiconductor zones 22 and complementary-conduction body zones 23 surrounding the first semiconductor zones 22. A second electrode 24 contacts a second highly doped semiconductor zone 25 which is formed by a substrate 52. A drift zone 26 extends between the body zones 23 and the second semiconductor zone 25 in the semiconductor body 20.

In this arrangement, the semiconductor device 1 of the present embodiment has a vertical structure and has so called trench gate electrodes 46 as control electrodes 27. These trench gate electrodes 46 are arranged in a trench structure 40 and insulated from the semiconductor body 20 by a gate oxide 28. In this arrangement, the control electrodes 27 in the form of the trench gate electrodes 46 act on the body zones 23 for controlling the semiconductor device 1.

When a control voltage is applied to the control electrode 27 or to the gate terminal G, respectively, a vertical channel forms between the first highly doped semiconductor zones 22 and the drift zone 26 in the complementary-conduction body zones 23 in the MOS field effect transistor with trench gate electrodes 46, illustrated by way of example in FIG. 1, so that a current can flow between a source terminal S on the top side 55 of the semiconductor body 20 to the drain terminal D on the rear side 54 of the semiconductor body 20. For this purpose, the rear side 54 of the semiconductor body 20 has a metallization 56 for the second electrode 24. The terminals such as emitter E and collector C and deviating conduction types such as p$^+$ of an IGBT semiconductor device which can also exhibit the subsequent invention are identified with brackets in FIG. 1.

At high cut-off voltages above 150 volts which must be switched when such a semiconductor device 1 is commutated from a conducting phase into a non-conducting phase, a dynamic avalanche can occur. To cushion or control the effects of such a dynamic avalanche, floating n-conducting minority charge carrier injector zones 30 are provided in the p-conducting body zones 23, which are surrounded by the body zone material, are provided in the present embodiment of the invention. The voltage between n-conducting injector zones 30 and p-conducting body zones 23 above which an avalanche is to start at the top planar first pn junction 32 of the minority charge carrier injector zone 30 can be adjusted by selecting the geometry in thickness and width of the n-conducting injector zones 30, by their doping and by the doping of the surrounding p-conducting body zones 23.

This makes it possible to determine the hole current density above which the n-conducting injector zones 30 should inject electrons into the semiconductor body 20. This makes it possible to counteract, e.g., a field steepening with avalanche at the non-conducting main pn junction 37 between body zone 23 and drift zone 26 or also at the trench bottom 49 of the trench gate electrode 46, and thus a reduction in the cut-off voltage at high avalanche current densities. In addition, this makes it possible to displace the snap-back in the current/voltage characteristic of the semiconductor device 1 towards higher current densities and thus distinctly to improve the ruggedness of the semiconductor device 1.

The injector zones 30 required for this purpose can have different geometries and can be shaped, for example, in island-form, strip-form or polygonal form. In this context, the extent $w_v$ of the injector zone 30 in the vertical direction in micrometers can be between 0.5 $\mu m \leq w_v \leq 10$ $\mu m$ with an integrated dopant dose $C_D$ between $1 \cdot 10^{12}$ cm$^{-2} \leq C_D \leq 1 \cdot 10^{16}$ cm$^{-2}$. In a further embodiment, the integrated dopant dose $C_D$ can be between $5 \cdot 10^{12}$ cm$^{-} \leq C_D \leq 5 \cdot 10^{14}$ cm$^{-2}$. The lateral extent $w_1$ of the injector zones 30 can be between 1 $\mu m \leq w_1 \leq 300$ $\mu m$ in micrometers. In a further embodiment, the extent $w_1$ of the injector zones 30 in the lateral direction is between 10 $\mu m \leq w_1 \leq 200$ $\mu m$ in micrometers.

The n-conducting injector zones 30 in the body zones 23 have in this arrangement a first top pn junction 32 on their top side 29 which, in the present embodiment, is oriented in the direction of the first electrode 21, and a lower second pn junction 33 which is oriented in the direction of the main pn junction 37 of the semiconductor device 1. In this embodiment, the p-conducting body zone material between the lower pn junction 33 and the main pn junction 37 of the semiconductor device 1 has such a low doping that the integral dopant charge f$N_A$dz in the vertical direction z is less or comparable, i.e., approximately equally large or even slightly larger than the breakdown charge $Q_{BR}$ of the semiconductor material which, in the present case is silicon, with a breakdown charge $Q_{BR} \approx 2 \cdot 10^{12}$ cm$^{-2}$, depending on the dopant magnitude, so that the subsequent relation:

$$fN_A dz \approx Q_{BR}$$

is maintained in this area of the body zone 23. In this context, z is the spatial coordinate in the direction of the field strength and $N_A$ is the dopant concentration in the body zone area. In this case, with a correspondingly high cut-off voltage, the electrical field occurring during the switching process in the nonconducting state can already lead to the injection of electrons and thus the modification of the cut-off voltage can be used, e.g., for an active clamping characteristic of the semiconductor device 1.

By this means, a selective avalanche breakdown is achieved in the area of the pn junction 32 with a correspondingly high voltage at the pn junction 32 which occurs locally between the body zone material and the highly doped n-conducting material of the minority charge carrier injection zone 30 doped complementarily to the body zone, and which thus offers the possibility of protecting the semiconductor device against premature and not localizable breakdowns which, in particular, are caused due to dynamic avalanche at the pn junction 37. If the minority charge carrier injection zone 30 extends to the surface of the semiconductor body 20, a punch-through effect can occur which is associated with a similar effect as with a selective avalanche breakdown. Analogously, an avalanche breakdown and/or a punch-through effect can also be achieved at the rear transition to the p-conducting substrate of an IGBT by a p-conducting injector zone doped complementarily to the drift section.

The body zone area can be doped by conventional acceptors like Boron. However it is also possible to replace a part of the pedestal doping by acceptors which exhibit at least an energy level of 70 mev above the valence band border such as the semiconductor elements In and Ga do in the case of Si. These acceptors are not completely ionized in the case of forward conduction, which allows a deeper punch through of the electric field in the direction toward the injector zones 30 which switch more quickly. In a static case the electric field will be stopped further ahead of the injection zones 30 by a persistent ionization effect.

Figure 2:
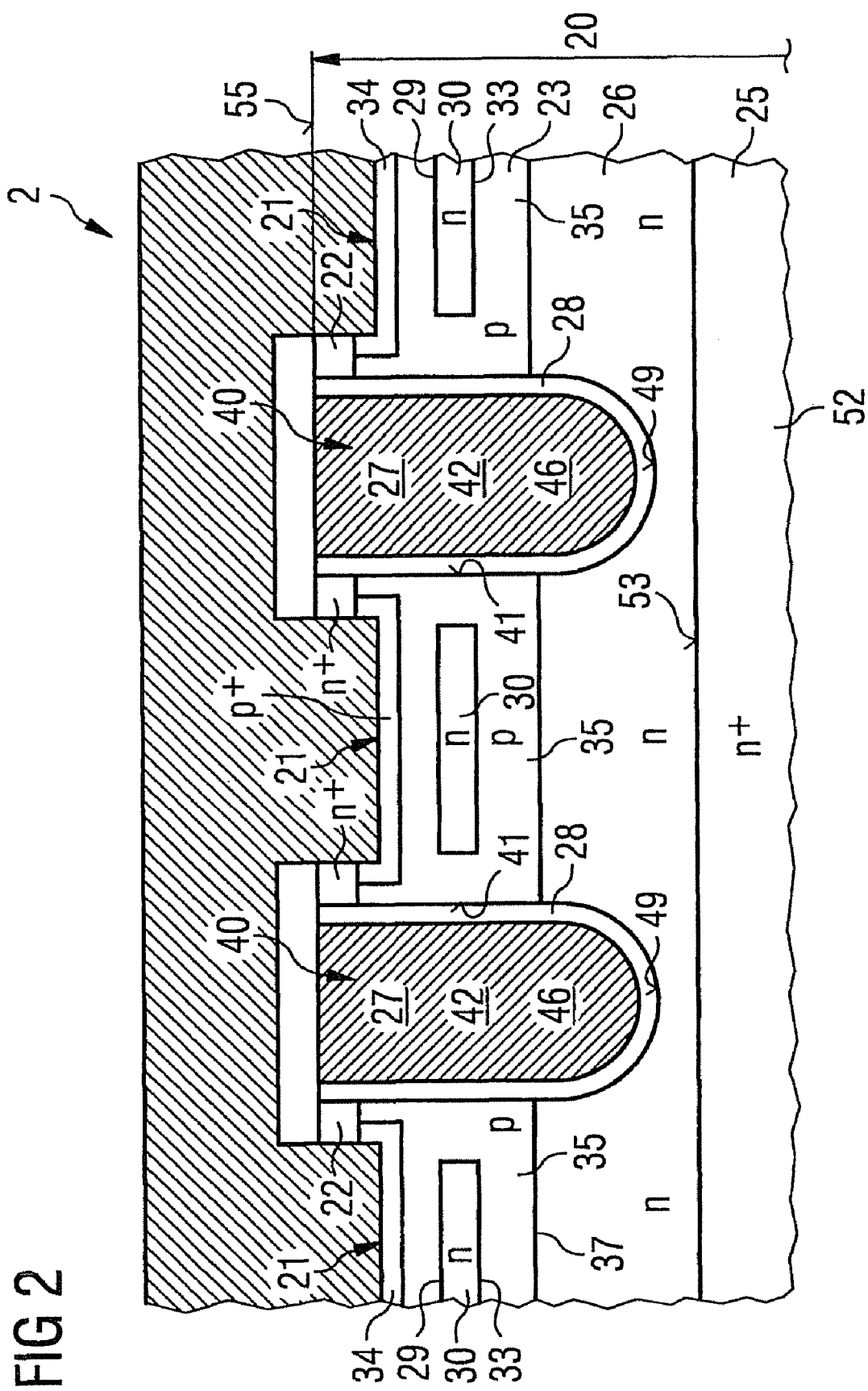
FIG. 2 illustrates a diagrammatic cross section through a semiconductor device according to a further embodiment.

FIG. 2 illustrates a diagrammatic cross section through a semiconductor device 2 according to a further embodiment. Components having the same functions as in FIG. 1 are identified by the same reference symbols and not explained separately. In this embodiment, the body zones 23 have differently doped areas, wherein first body zone areas 34 are contacted by the material of the first electrode 21 and are doped higher than second body zone areas 35 surrounding them, which form the main pn junctions 37 to the drift zone 26 and also contact the gate oxide 28 of the trench gate electrodes 46.

In this arrangement, the first body zone area 34 is doped higher than the second body zone area 35 in which the minority charge carrier injector zones 30 are arranged. The more highly doped p-conducting first area 34 improves the contact transition between the first electrodes 21 and the body zones 23. To adjust the beginning of an avalanche multiplication or of the dynamic avalanche, respectively, the n-conducting injector zones 30 are arranged spaced apart from the first $p^+$-conducting body zone area 34 in this embodiment of the invention.

Figure 3:
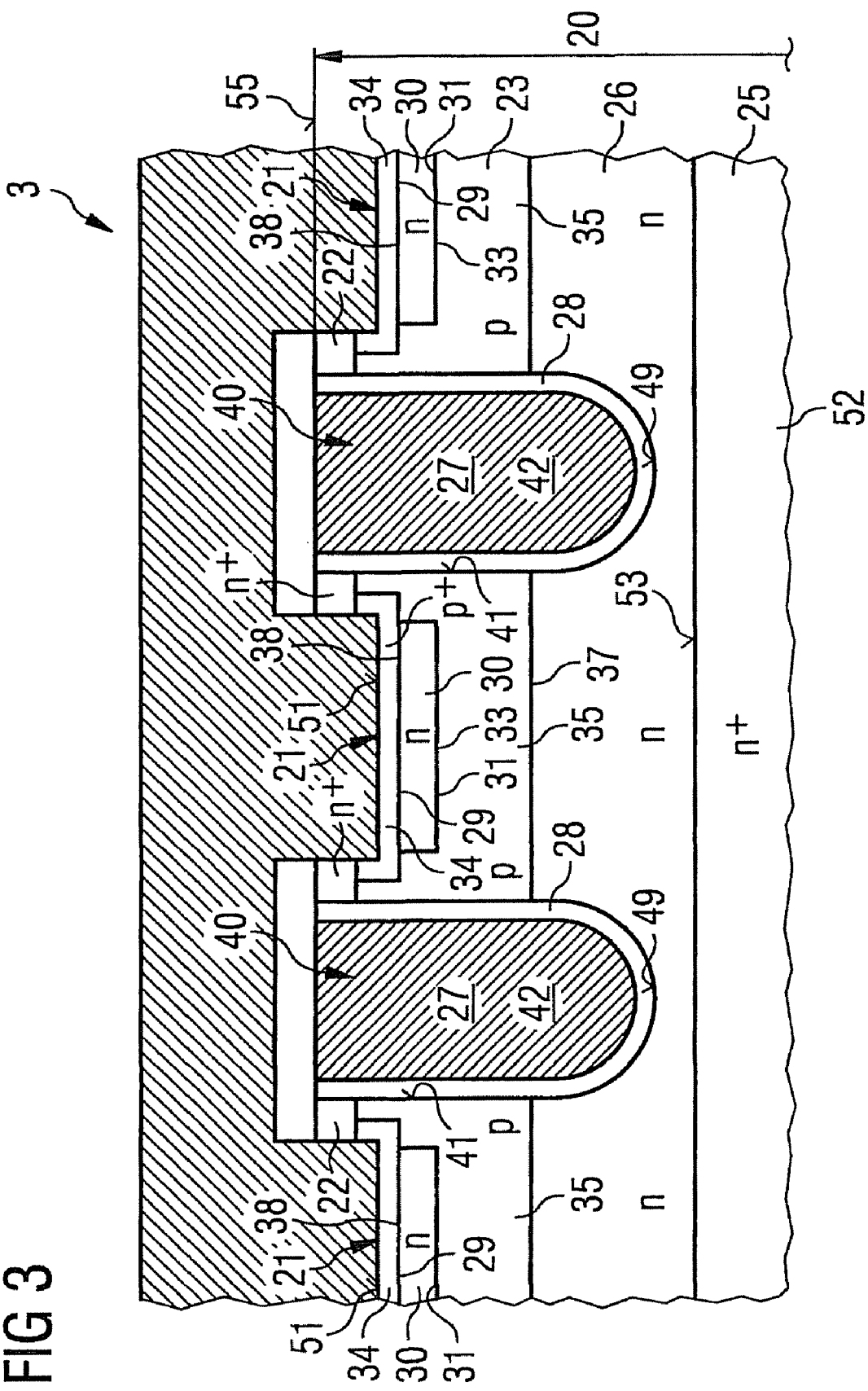
FIG. 3 illustrates a diagrammatic cross section through a semiconductor device according to a further embodiment.

FIG. 3 illustrates a diagrammatic cross section through a semiconductor device 3 of a further embodiment. In this embodiment, injector zones 30 form with their top sides 29 a pn junction 38 between the $p^+$-conducting first body zone area 34 whereas the undersides 31 still form a pn junction 33 with the more weakly p-doped body zone areas 35. If the hole densities in the area of the trench bottom 49 or of the main pn junction 37 are too high, electrons can be emitted from the n-conducting injector zones 30 into the high-field zone, if necessary, and thus counteract the dynamic avalanche.

For this purpose, the n-doped injector zones 30 are positioned in the area of the contact holes 51 in the present embodiment in order to avoid a disadvantageous influence of the electrons generated by these n-conducting injector zones 30. Apart from the implementation of such a structure, illustrated here, in a vertical or lateral MOS field effect transistor which can also have p-doped compensation regions in the drift zone, this structure can also have a positive effect on the electric characteristic in IGBT (Insulated Gate Bipolar Transistors).

Figure 4:
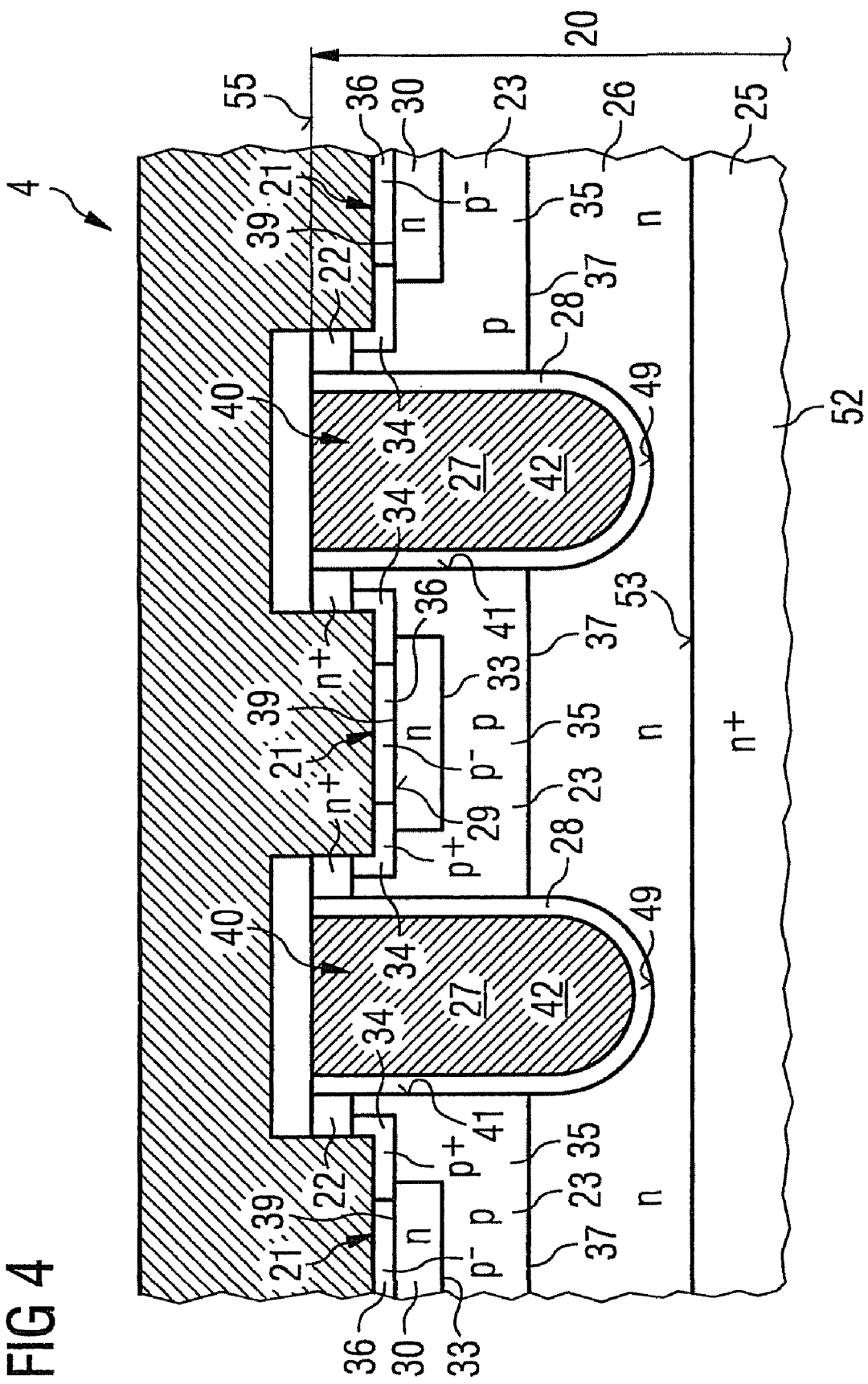
FIG. 4 illustrates a diagrammatic cross section through a semiconductor device according to a further embodiment.

FIG. 4 illustrates a diagrammatic cross section through a semiconductor device 4 according to a further embodiment. In this embodiment, the body zone 23 has a third body zone area 36 which has a lower dopant concentration than the second body zone area 35 and which is arranged between the injector zones 30 and the first electrodes 21. In this arrangement, the $p^−$-doping of this third body zone area 36 is of the order of magnitude of the breakdown charge of the semiconductor material or also slightly higher so that the electron injection starts at a corresponding punch-through voltage. This punch through effect, and thus the desired electron injection, is considerably enhanced particularly dynamically, i.e., at high hole densities in the body zone 23.

Figure 5:
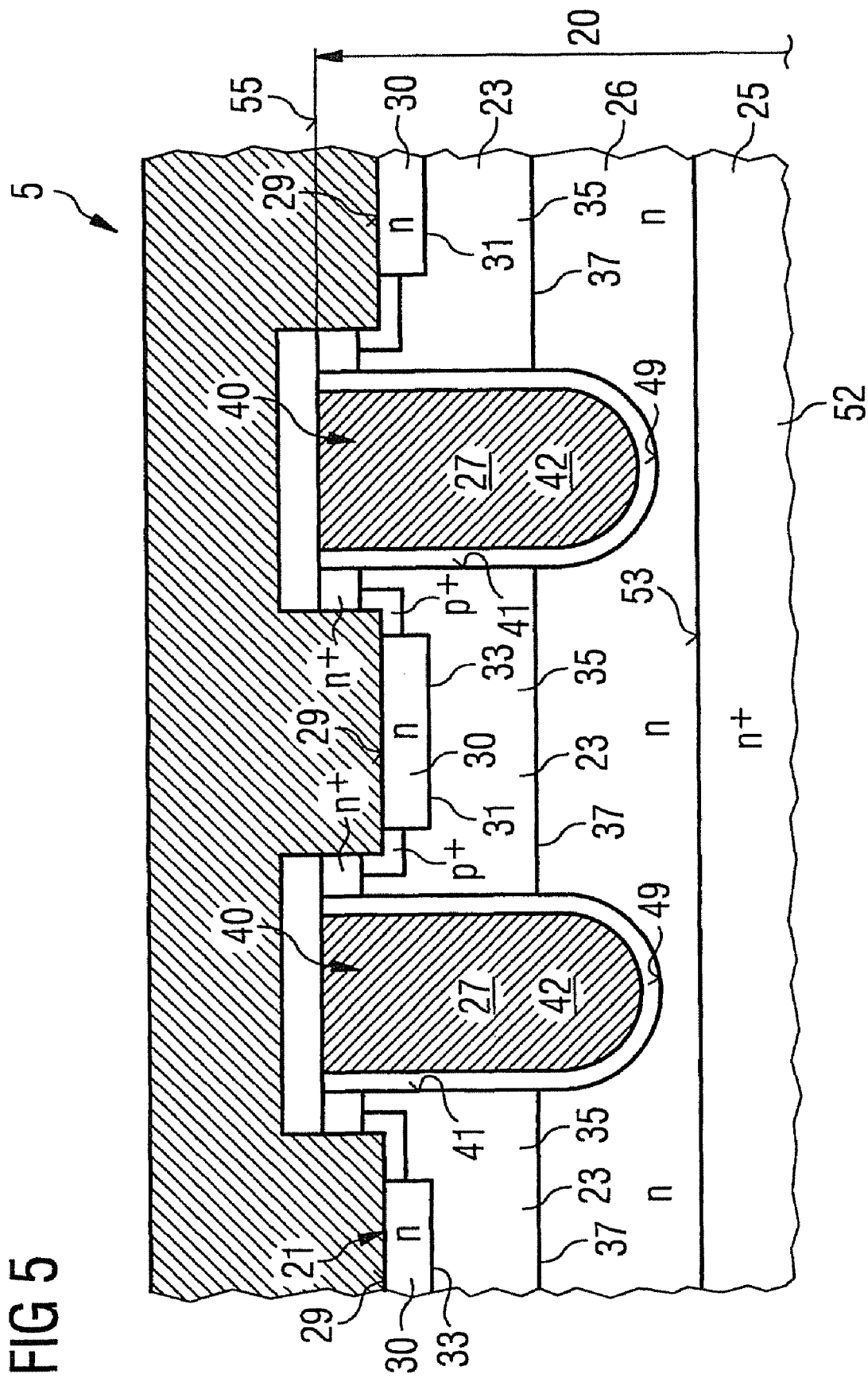
FIG. 5 illustrates a diagrammatic cross section through a semiconductor device according to a further embodiment.

FIG. 5 illustrates a diagrammatic cross section through a semiconductor device 5 of a further embodiment. In this embodiment, the injection zones 30 are arranged within the body zones 23 in such a manner that their top sides 29 contact the first electrodes 21 and their undersides 31 have a pn junction 33 with the second body zone area 35. In this arrangement of the injection zones 30, the dopant dose of the injection zones 30 must not be selected to be too low in order to avoid a punch through of the space charge zone to the second electrode 21.

Depending on the magnitude of the surrounding p-dopant charge, the blocking capability can be either increased or also lowered in this area 35 of the body zone 23 provided with the additional n-conducting injector zone, and thus by corresponding masking, either the areas not provided with these additional injector zones 30 or the remaining areas can be used as clamping region. If high switching loads are used, it may also be necessary to provide higher p-dopant charges in the body zone 23.

Figure 6:
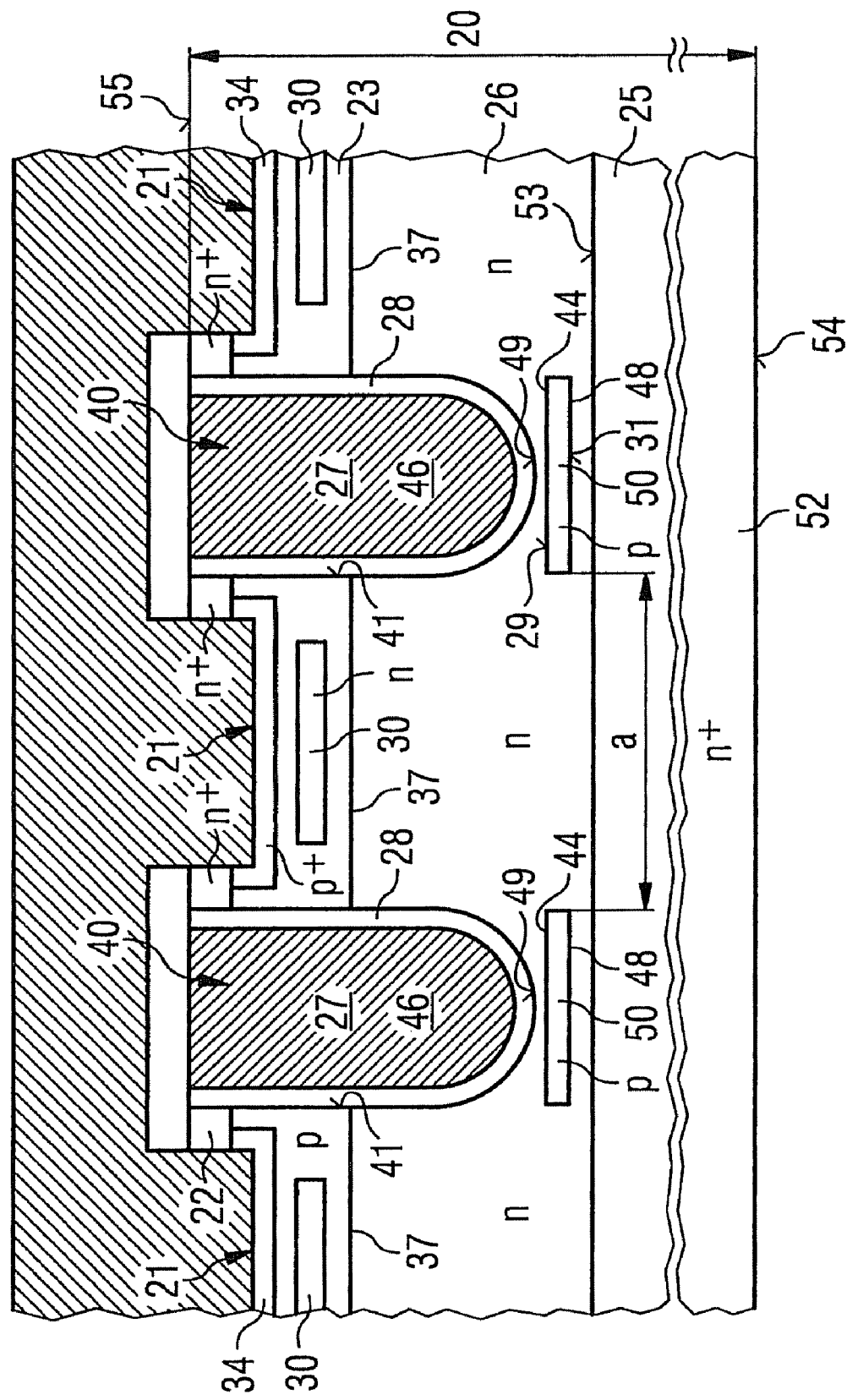
FIG. 6 illustrates a diagrammatic cross section through a semiconductor device according to a further embodiment.

FIG. 6 illustrates a diagrammatic cross section through a semiconductor device 6 of a further embodiment. In this semiconductor device 6, it is not only minority charge carrier injector zones 30 which are provided in the area of the body zones 23 but also minority charge carrier injector zones 50 which are provided in the drift zone 26 at the transition between n-conducting drift zone material and $n^+$-conducting or $p^+$-conducting material of the second highly doped zone 25 of the semiconductor body 20.

The extent $w_v$ of such an injector zone 50 can be between $0.1~\mu m \leq w_v \leq 10~\mu m$ in the vertical direction in micrometers with an integrated dopant dose $C_D$ between $1 \cdot 10^{12}~cm^{-2} \leq C_D \leq 1 \cdot 10^{16}~cm^{-2}$. In another embodiment, the integrated dopant dose $C_D$ is between $5 \cdot 10^{12}~cm^{-2} \leq C_D \leq 5 \cdot 10^{14}~cm^{-2}$. In addition, the injector zones 50 can also be arranged in a field stop zone as will still be illustrated in the text which follows.

Arranging such additional injector zones 50 in the vicinity of the second highly doped area 25 of the semiconductor device 6 provides a more advantageous commutation characteristic of the semiconductor device 6. When such power MOS field effect transistors are commutated off with flooded body diode with main pn junction 37, voltage peaks occur during the commutation process since the reverse current breaks off severely. This interruption is undesirable since this interruption greatly degrades the EMC characteristic of the semiconductor device 6 in the applications.

As already mentioned above, this problem occurs especially in semiconductor devices with nominal cut-off voltages above 70 volts, particularly above 150 volts, especially since at very low cut-off voltages, the background doping is so high that there is scarcely a flooding of the "lowly" doped region for accepting the space charge zone in the nonconducting case with electrons and holes. To counteract this interruption effect of the reverse current, a pedestal zone has previously been used with correspondingly great thickness and low doping. In this arrangement, a dimensioning was selected which goes beyond the requirements of the static non-conducting characteristic. This was done analogously to fast-switching diodes in which the base must be correspondingly wide in order to achieve a gradual switching characteristic.

However, this measure is disadvantageously associated with resistive forward losses due to this over-dimensioned pedestal layer. Using FIG. 6 and the additional minority charge carrier injector zones 50, a thick, lowly doped pedestal zone can be omitted and a gradual turning-off can still be achieved because the electrical field stops before the now p-conducting injector zones 50 in the nonconducting case in order to avoid increased static leakage currents. During the commutation, the electrons flowing off to the drain region, namely the second highly doped semiconductor zone 25, cause a corresponding voltage drop which is present across the pn junction 48 as cut-off voltage.

This pn junction 48 of the p-conducting minority charge carrier injector zones 50 is driven into the avalanche and, in turn, injects holes into the surrounding drift zone region. As a result, the mountain of flooding charge which is removed by the reverse current cannot become detached from the rear n⁻ n⁺-junction which is a necessary prerequisite for a gradual switching characteristic of the body diode.

In short-circuit mode of the transistor or during avalanche with high current densities, the p-conducting injector zones 50 of the drift zone 26 close to the nn⁺-junction lead to a stabilization of the gradient of the electrical field since a controlled injection of holes also occurs if the electrical field is flattened by a high electron density to such an extent that it reaches further up to the p-conducting injector zones 50 than in the static cut-off case without current. In particular, the egawa effect, which includes flipping over the vertical distribution of the electrical field at high electron current densities, can be reduced greatly by the described measure with the aid of the p-conducting injector zones 50.

The p-conducting injector zones 50 can also be inserted into a field stop zone situated before the highly doped injector zones 50 and 25, respectively, this field stop zone being doped more highly than the drift zone and lower than the zone 50 and 25, respectively, having a doping dose in the range of the breakdown charge, for example approx. $2 \cdot 10^{12}$ cm$^{-2}$, for silicon, or even larger than the breakdown charge in order to prevent the punch through of the space charge zone to the highly doped zone 50 and 25, respectively. This field stop zone can also extend up to the highly doped zone 52. The measures described can also be used with MOSFETs which have compensation structures, or also in IGBTs, wherein, in the case of IGBTs, the highly doped zone 25 can be constructed as substrate, but can also be generated, e.g., by implantation in combination with subsequent high-temperature processes. The measure of implementing p-conducting injector zones 50 close to the pn junction can also be used without providing the n-doped injector zones 30 in the body region, both in the case of MOSFETs which can have, e.g., trench electrodes or other compensation structures such as, e.g., columns doped complementarily to the drift zone, and in IGBTs.

As is illustrated in FIG. 6, the case of trench MOS devices is used here in which the p-conducting injector zones 50 are arranged in such a manner that the avalanche current flowing in the area of the trench bottom 49 flows in the direction of these p-conducting injector zones 50, i.e., the p-conducting injector zones 50 are positioned in the area of the trench bottom 49. With a suitable dimensioning of the proportion of the areas of top side 29 and underside 31 and of the size of the individual p-conducting injector zones 50 and their distances a, the flooding of the semiconductor device 6 with charge carriers can also be modulated locally differently in that, the larger the proportion of p-conducting area, the lower the charge carrier density of the flooding charge in the n-conducting drift zone 26 located ahead. As a result, the on-state voltage and the switching losses can be selectively reduced.

Especially in the area of the edge termination, not illustrated here, the lateral extent of p-conducting injector zones 50 and their distance can be correspondingly adapted depending on the effectiveness of this edge termination so that as homogeneous a breakdown as possible is achieved both dynamically and statically in the case of an avalanche. Similarly, the flooding charge can be selectively reduced in the area of the edge termination in order to selectively provide for switching ruggedness of the inverse diode of the semiconductor device 6.

In contrast to IGBT and diodes, it may be appropriate to select the proportional area of p-conducting injector zones 50 to be not too large in the cell area of MOS field effect transistors in order to avoid an unwanted increase in the turn-on resistance $R_{ON}$. The magnitude of doping of the injector zone 50 and the magnitude of doping of the surrounding drift zone 26 can be correspondingly adapted in order to achieve the desirable breakdown voltage.

Figure 7:
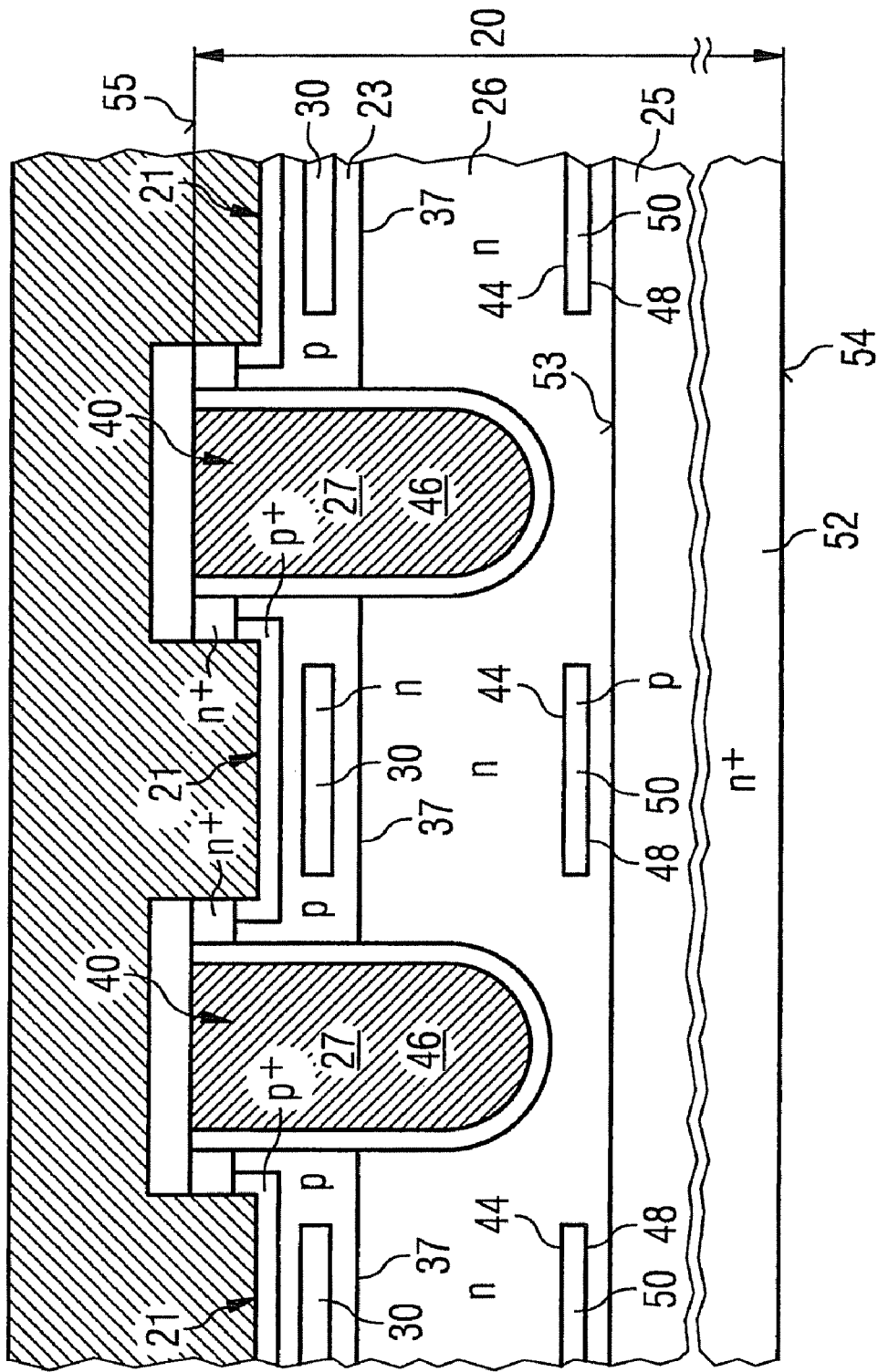
FIG. 7 illustrates a diagrammatic cross section through a semiconductor device according to a further embodiment.

FIG. 7 illustrates a diagrammatic cross section through a semiconductor device 7 of a further embodiment. In this embodiment, p-conducting injector zones 50 are arranged in the drift zone material close to the nn⁺-junction offset with respect to the trench structures 40 of the trench gate electrodes 46. The action of these p-conducting injector zones 50 has the aim of subtracting avalanche states from a main pn junction 37 between body zone 23 and drift zone 26 and to homogenize them in the vicinity of the nn⁺-junction.

Figure 8:
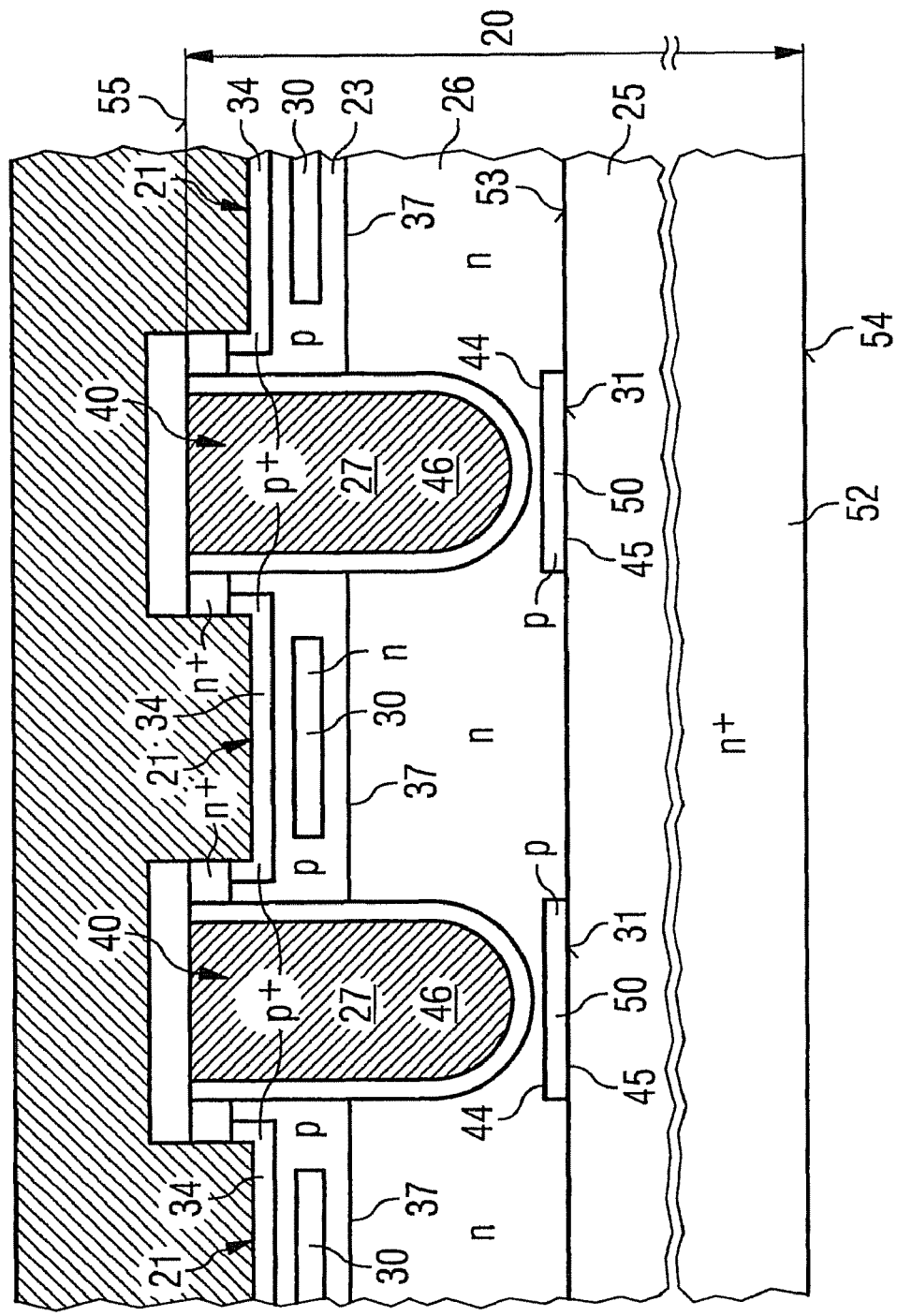
FIG. 8 illustrates a diagrammatic cross section through a semiconductor device according to a further embodiment.

FIG. 8 illustrates a diagrammatic cross section through a semiconductor device 8 according to a further embodiment. In this embodiment, the additional p-conducting injector zones 50 form with their undersides 31 a pn junction with the n⁺-conducting material of the second highly doped semiconductor zone 25 and are arranged below the trench structure 40 of the trench gate electrodes 46 as in FIG. 6.

Figure 9:
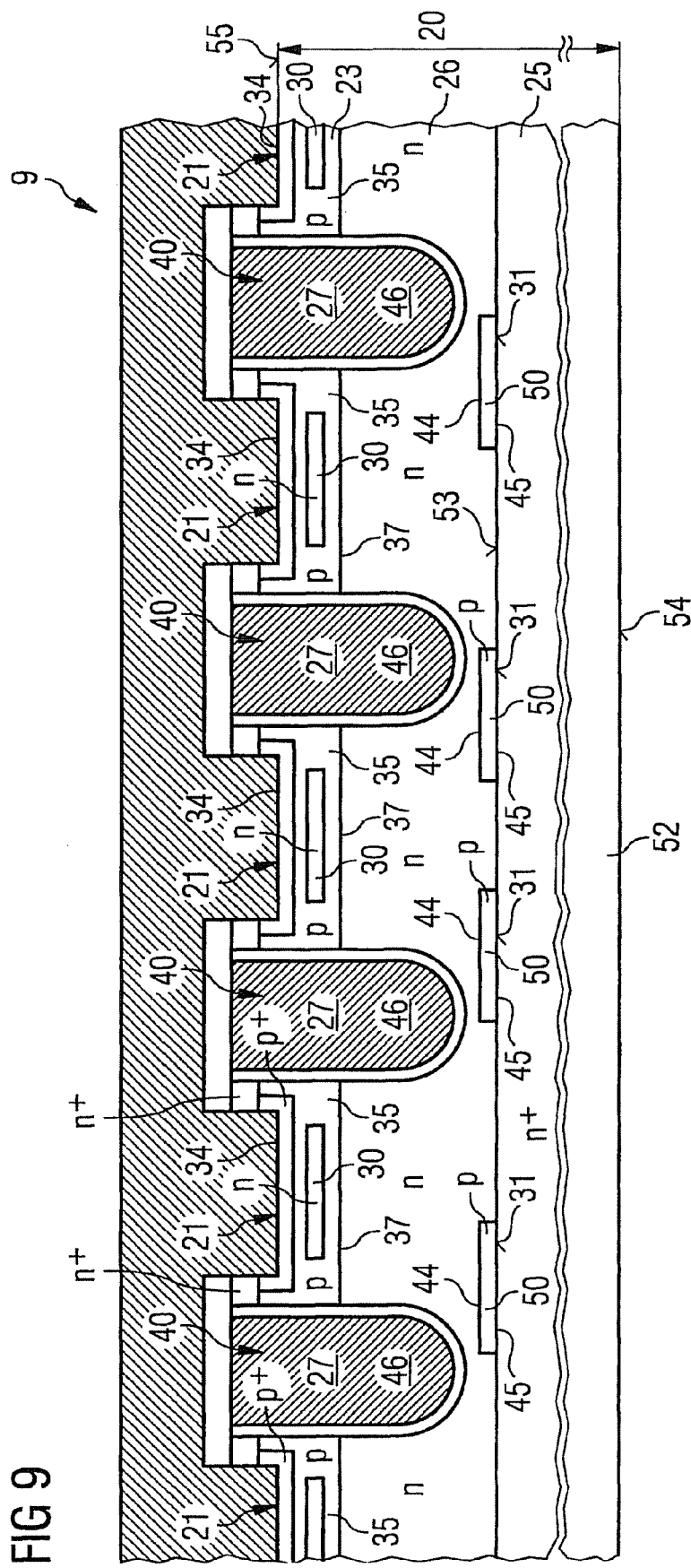
FIG. 9 illustrates a diagrammatic cross section through a semiconductor device according to a further embodiment.

FIG. 9 illustrates a diagrammatic cross section through a semiconductor device 9 of a further embodiment of the invention wherein the undersides 31 of the p-conducting injector zones 50 again form pn junctions with the n⁺-conducting material of the second highly doped semiconductor zone 25. However, the p⁺-conducting injector zones 50 are in this case arranged in a grid pitch different from the trench gate electrodes 46 and thus appear offset with respect to the trench gate electrodes 46.

Figure 10:
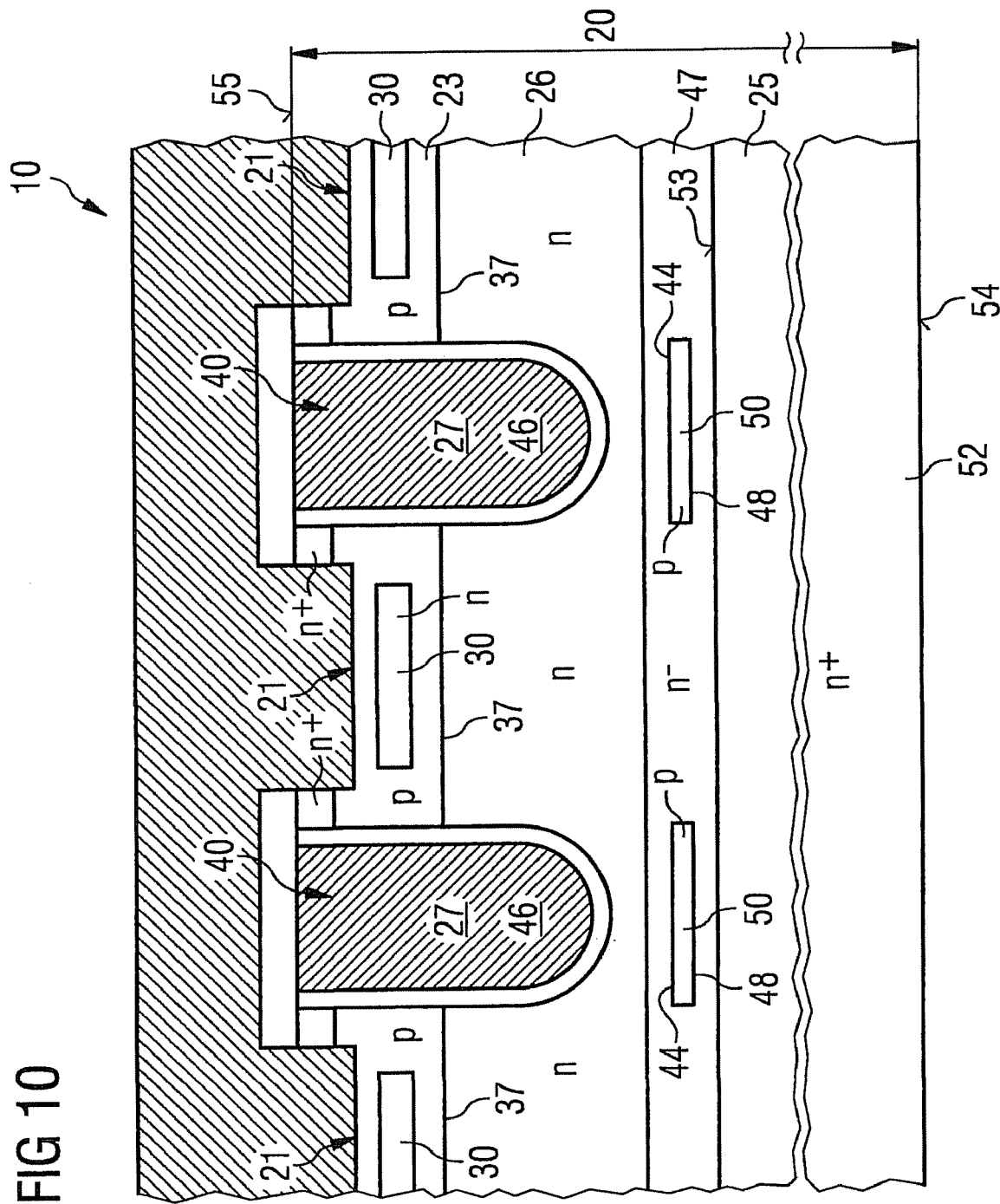
FIG. 10 illustrates a diagrammatic cross section through a semiconductor device according to a further embodiment.

FIG. 10 illustrates a diagrammatic cross section through a semiconductor device 10 of a further embodiment. In this embodiment, a soft switching characteristic of the semiconductor device is achieved by the fact that a pedestal zone 47 which has a lower doping than the drift zone 26 is additionally provided between the drift zone 26 and the second highly doped semiconductor zone 25 in order to avoid a current interruption when the semiconductor device 10 is commutated off.

However, compared with the conventional dimensioning of such a pedestal zone 47 in which it has been assumed that, analogously to fast-switching diodes, a base had to be correspondingly widened, an improvement of the switching characteristic of field effect devices with a reduced vertical extent of the weakly doped pedestal zone 47 is now also possible which reduces the forward resistance. In this embodiment, the pedestal zone 47 is thus distinctly reduced in its thickness, on the one hand, and, on the other hand, p-conducting floating injector zones 50 which have an extremely small vertical extent are additionally provided in the pedestal zone 47. Nevertheless, the slight increase in turn-on resistance which may result can be compensated for by the reduction in thickness of the pedestal zone 47 and also of the drift zone.

In addition, a compensation of the pedestal doping surrounding the p-conducting injector zones 50 by using these injector zones 50 is possible which is why the pedestal doping can be made higher than in the case of conventional MOS field effect transistors. The semiconductor device thus has between the drift zone 26 and the second semiconductor zone 25 a pedestal zone 47, which is doped more weakly than the drift zone 26, of the same type of conduction as the drift zone 26 and has complementary-conduction minority charge carrier injector zones 50.

In this arrangement, the injector zones so in this embodiment are equipped with a planar pn junction 44 in the direction of the first electrode 21 and a planar second pn junction 48 in the direction of the second electrode and are arranged within the weakly doped pedestal area 47 in such a manner that they are surrounded by the material of the pedestal area 47. In contrast to the next figure, the p-conducting injection zones 50 are oriented to the trench gate electrodes 46 in this case.

The low doped podestal area 47 may be doped by conventional donors like P, As or Sb. However it is also possible to replace a part of the podestal area by donors having energy levels of at least 150 mev below the conduction band border, such as S or Se. These donors are not completely ionized and have the possibility to support a deeper punch through of the electric field in the direction toward the injector zones 50 which will switch more quickly. In a static case the electric field will be stopped further ahead of the injection zones 50 by an persistent ionization effect.

Figure 11:
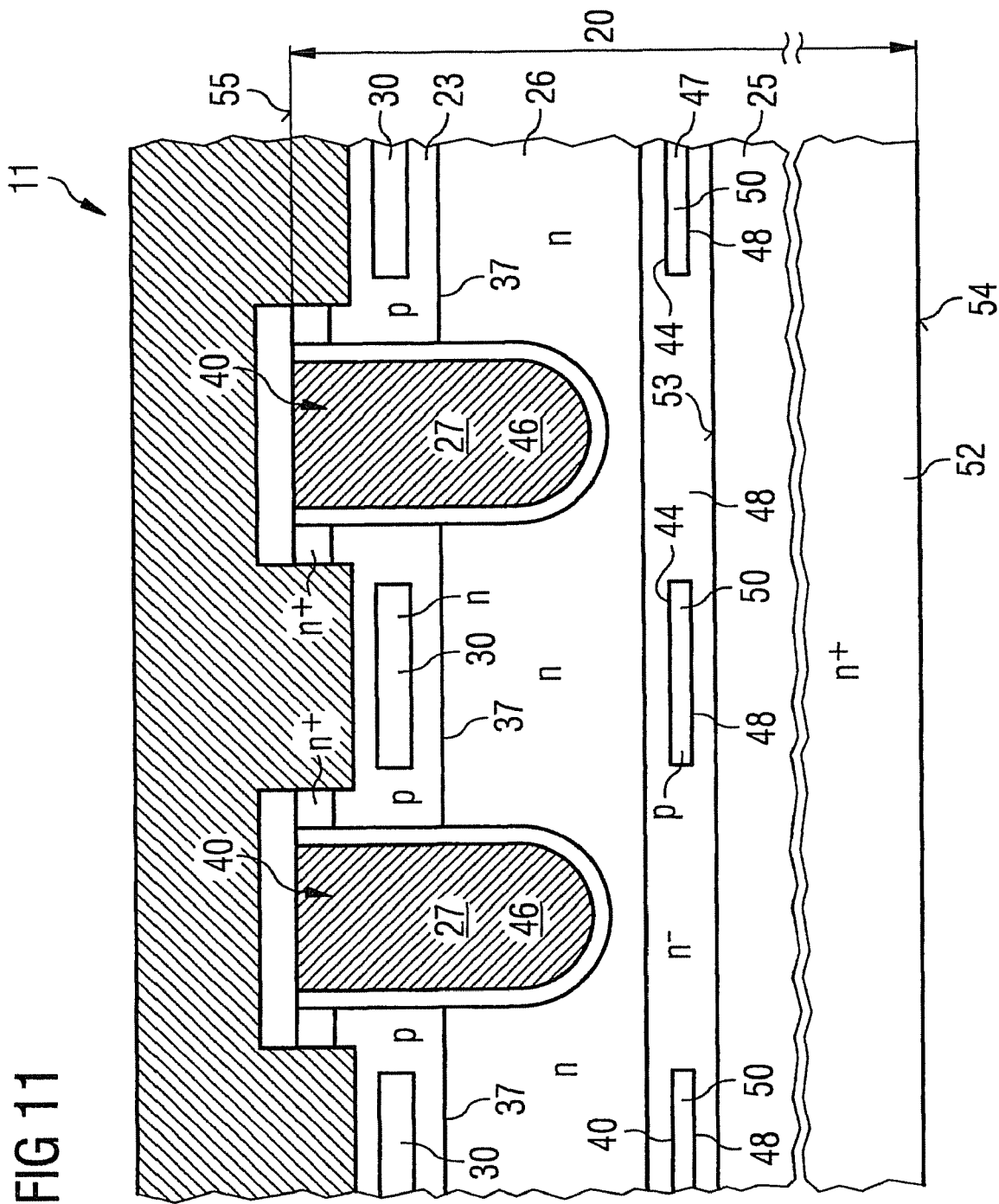
FIG. 11 illustrates a diagrammatic cross section through a semiconductor device according to a further embodiment.

FIG. 11 illustrates a diagrammatic cross section through a semiconductor device 11 according to a further embodiment, wherein the p-conducting injector zones 50 in the weakly doped pedestal area 47, which are completely surrounded by the material of the slightly doped body zone 47, are arranged offset with respect to the trench gate electrodes 46.

Figure 12:
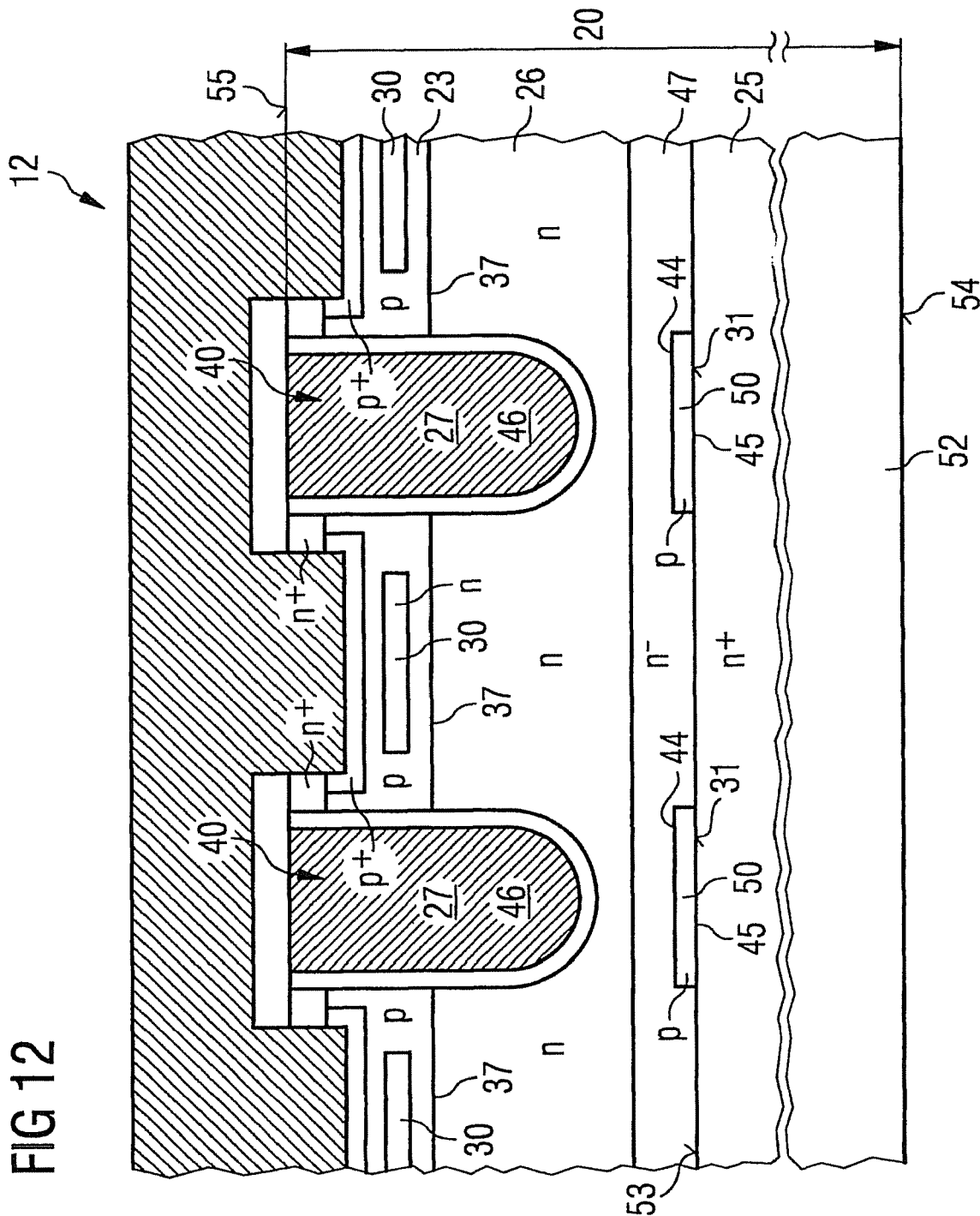
FIG. 12 illustrates a diagrammatic cross section through a semiconductor device according to a further embodiment.

FIG. 12 illustrates a diagrammatic cross section through a semiconductor device 12 of a further embodiment, wherein, in the present case, p-conducting injector zones 50 which, with their undersides 31, form a pn junction 45 with the highly doped n+-conducting second semiconductor zone 25, are arranged in a more weakly doped pedestal zone 47.

Figure 13:
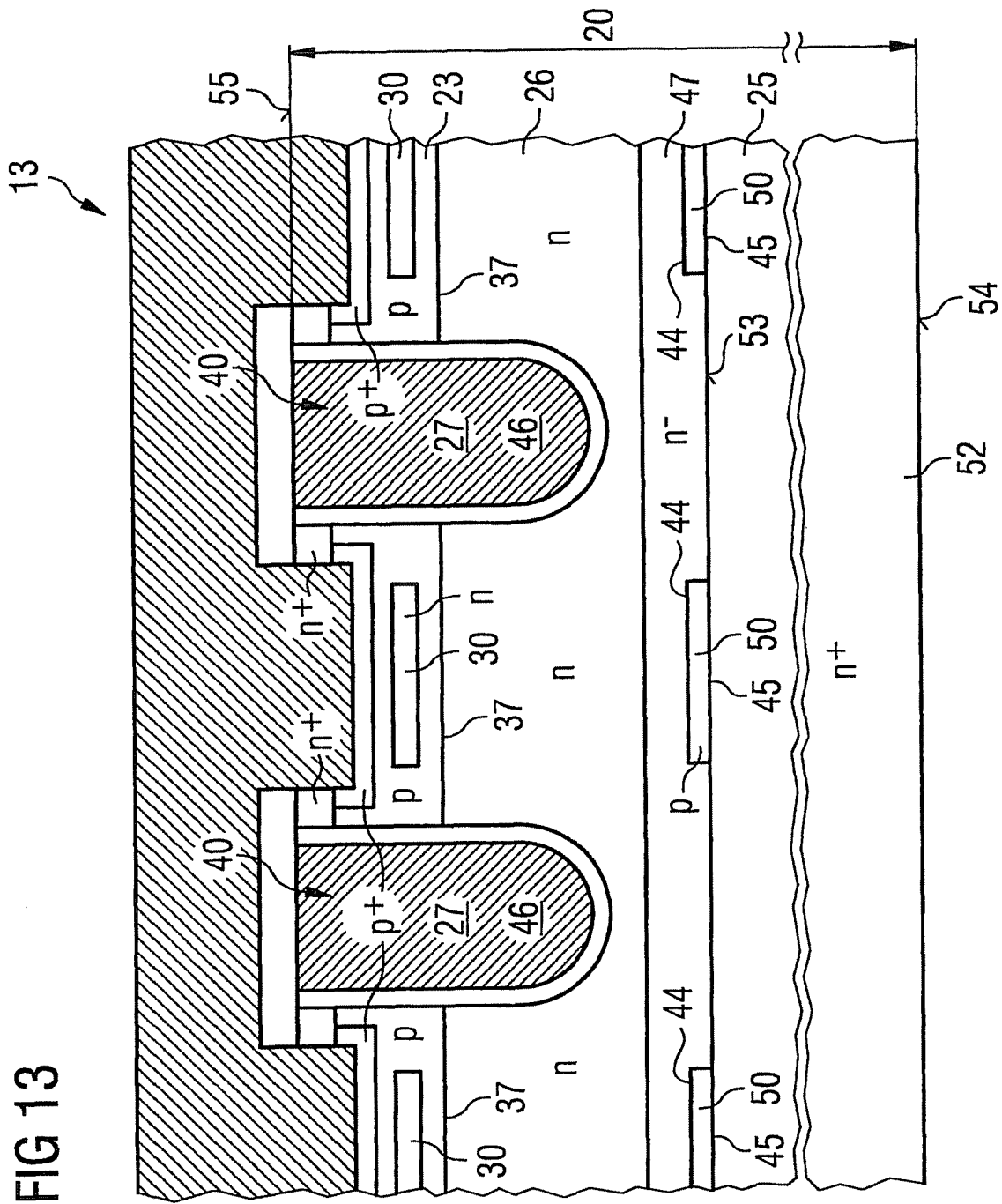
FIG. 13 illustrates a diagrammatic cross section through a semiconductor device according to a further embodiment.

FIG. 13 illustrates a diagrammatic cross section through a semiconductor device 13 of a further embodiment, wherein the p-conducting injection zones 50 are now arranged offset with respect to the trench gate electrodes 46 in the n-doped pedestal zone 47 with pn junction 45 to the highly doped second semiconductor zone 25.

Figure 14:
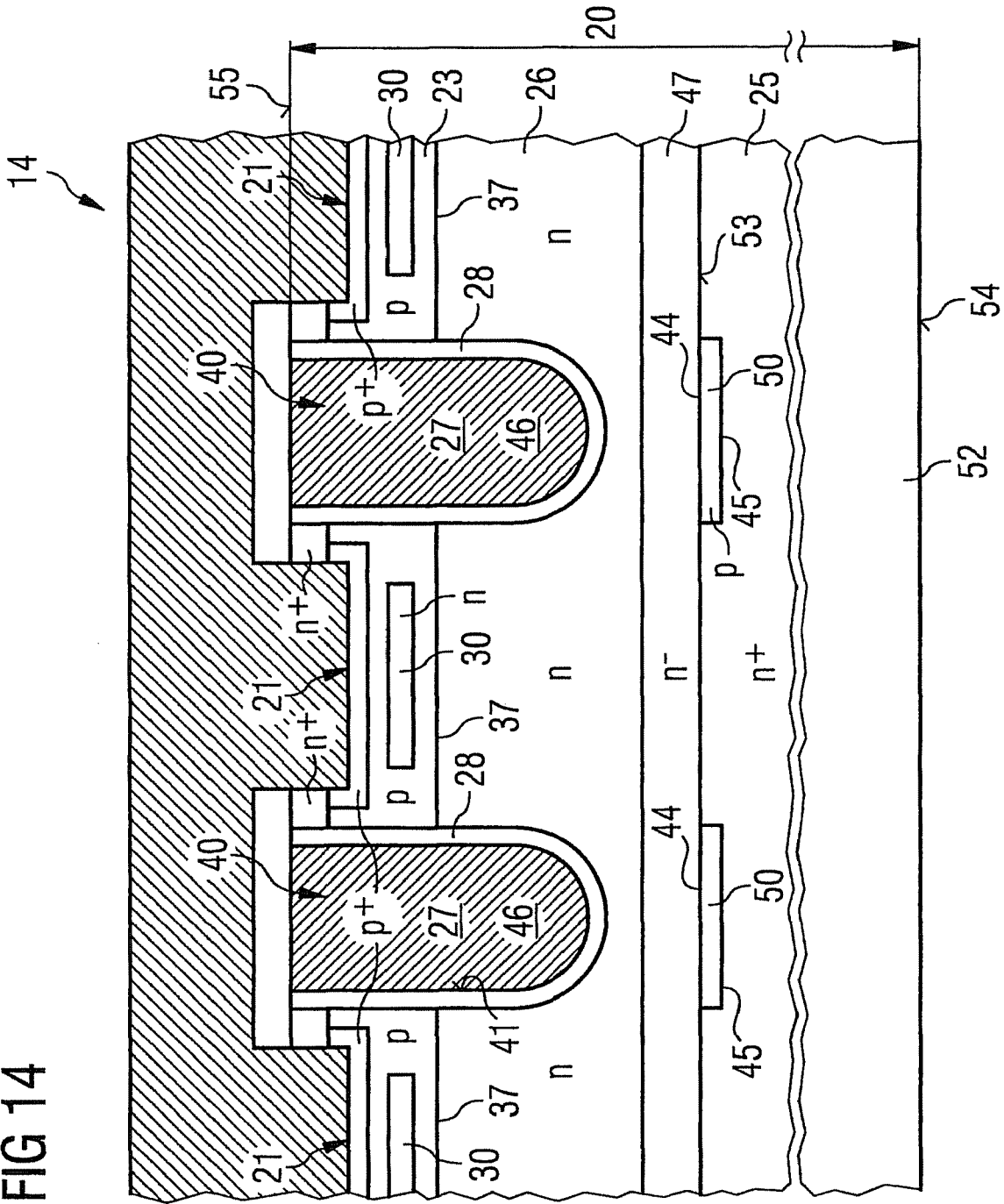
FIG. 14 illustrates a diagrammatic cross section through a semiconductor device according to a further embodiment.

FIG. 14 illustrates a diagrammatic cross section through a semiconductor device 14 of a further embodiment, wherein the p-conducting injection zones 50 protrude into the highly doped n+-conducting second semiconductor zone 25 below the trench gate electrodes 46. This embodiment has one advantage that before an epitaxial layer is applied for representing the weakly n-doped pedestal zone 47 and the slightly more highly doped drift zone 26, the p-conducting injection zones 50 can be already inserted into the semiconductor substrate 52.

Figure 15:
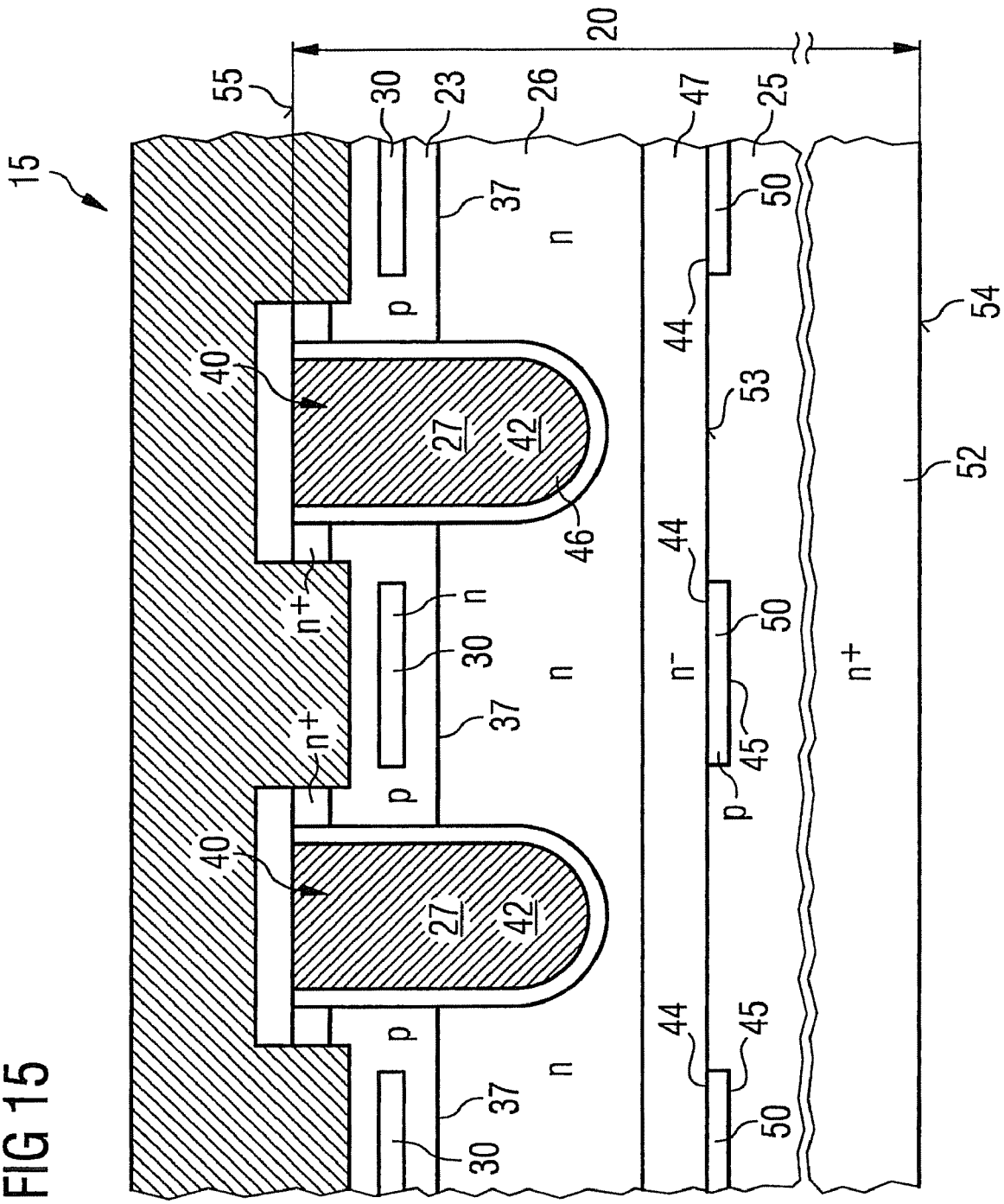
FIG. 15 illustrates a diagrammatic cross section through a semiconductor device according to a further embodiment.

FIG. 15 illustrates a diagrammatic cross section through a semiconductor device 15 of a further embodiment, in which the p-conducting injector zones 50 are also arranged in the nn+-transition area to the second highly doped semiconductor zone 25 but are this time inserted offset with respect to the trench gate electrodes 46.

Figure 16:
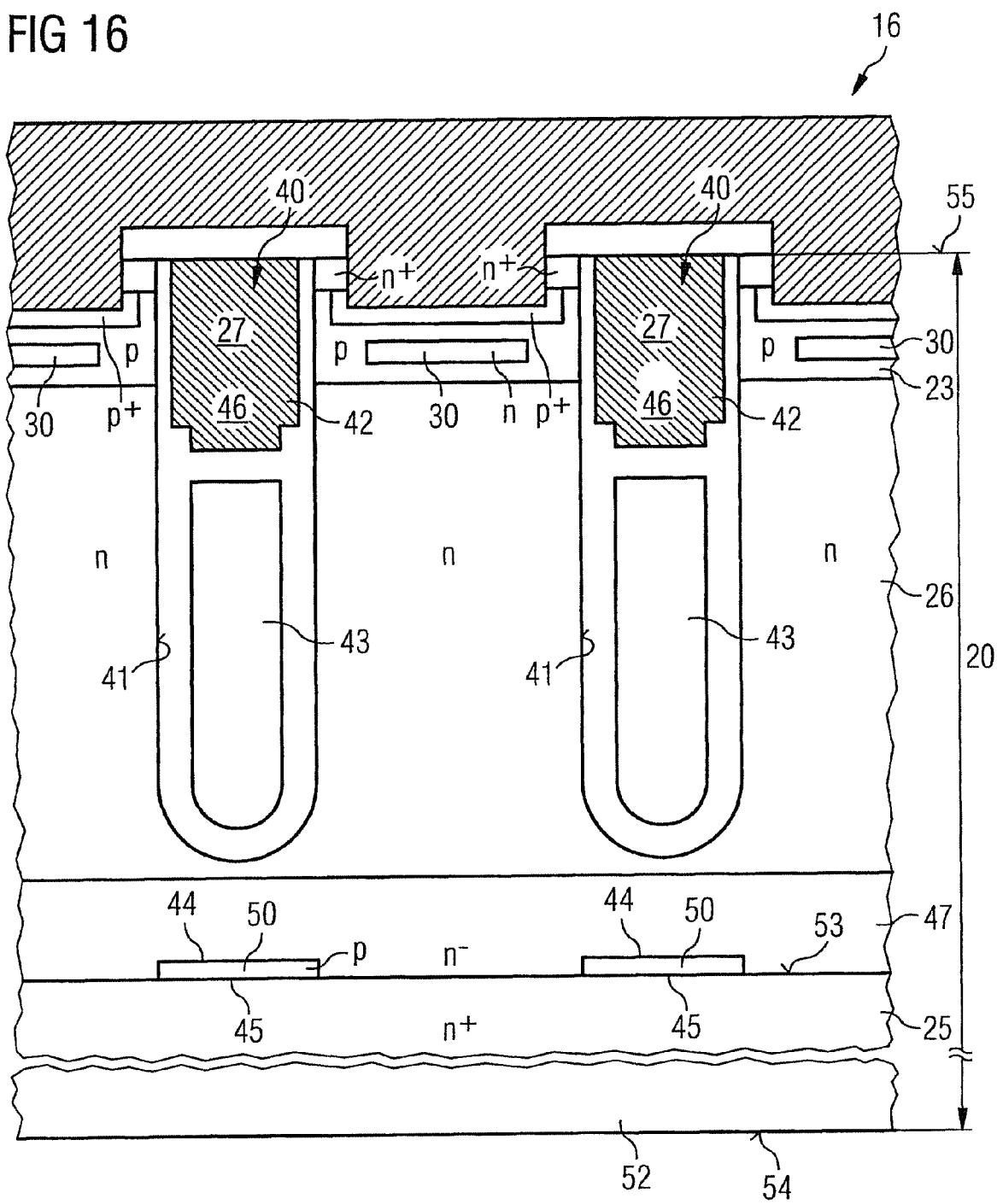
FIG. 16 illustrates a diagrammatic cross section through a semiconductor device according to a further embodiment.

FIG. 16 illustrates a diagrammatic cross section through a semiconductor device 16 of a further embodiment. In this embodiment, the minority charge carrier injector zones 30 and 50 are used for a semiconductor device structure in which the trench structure 40 also has a further buried electrode 43 in addition to the trench gate electrode 46. This buried electrode 43 can be placed at gate or at source potential and represents a field plate which influences the field distribution in the drift zone 26. The positive effects of the p-conducting injector zones 50 arranged below the additional buried electrode 43 in this structure can also develop in this case.

Figure 17:
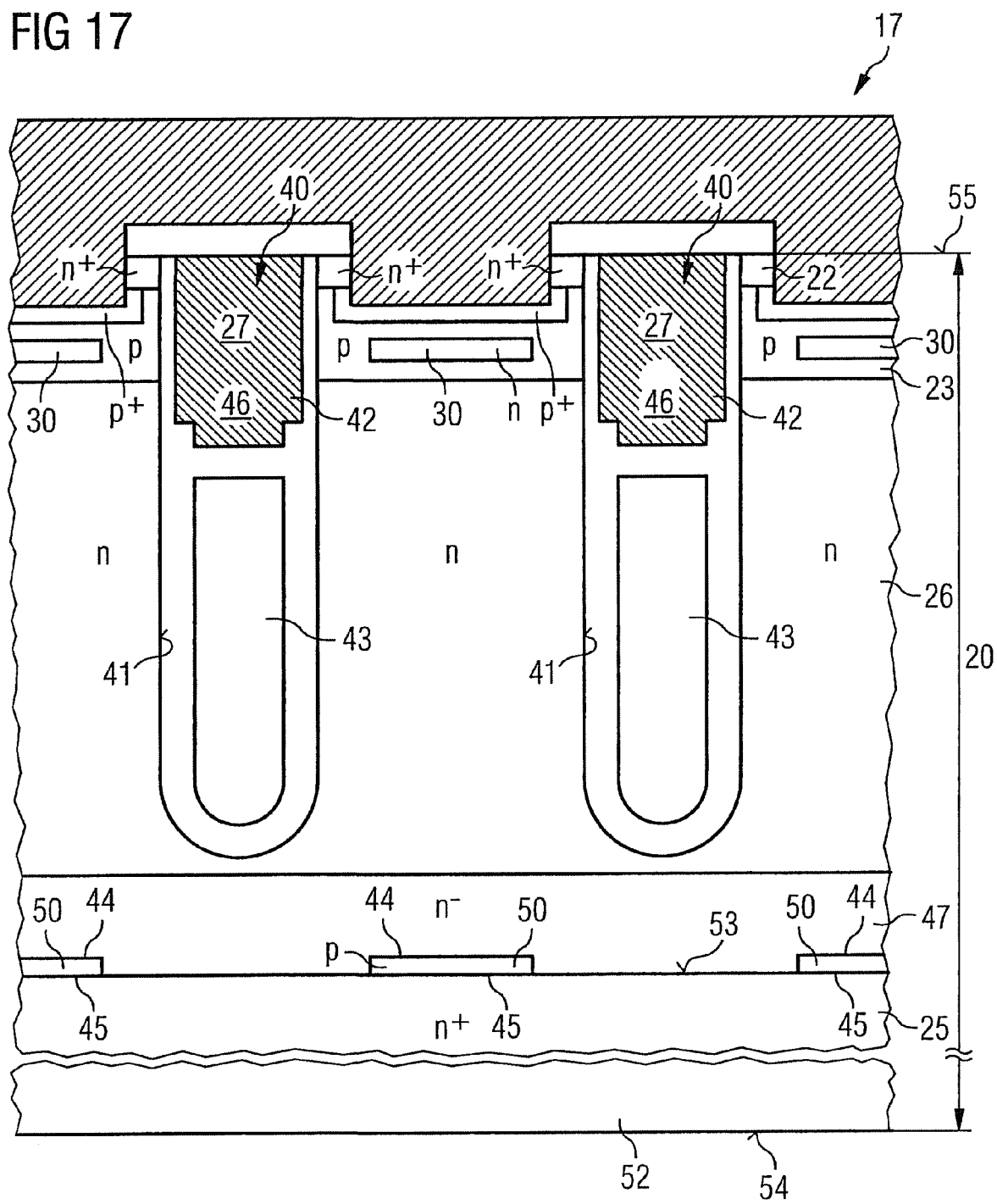
FIG. 17 illustrates a diagrammatic cross section through a semiconductor device according to a further embodiment.

FIG. 17 illustrates a diagrammatic cross section through a semiconductor device 17 of a further embodiment. The difference from the semiconductor device 16 according to FIG. 16 consists in that the p-conducting injector zones 50 are now arranged in a low-doped pedestal zone 47 offset with respect to the buried electrodes 43.

The multiple variants of the arrangement of injector zones 30 or 50, listed above, can be used in compensation semiconductor devices with charge compensation zones extending vertically and doped complementarily to the drift zone. For this purpose, the charge compensation zones can be arranged in the form of columns or trenches in the drift zones. Especially in the case of power MOSFETs with vertical field plates for charge carrier compensation in a drift section, injector zones 30 can be provided in the body zone material or injector zones 50 in the drift zone material. It is also possible to provide injector zones 30 and 50 both in the body zone material and in the drift zone material. In the case of an IGBT (Insulated Gate Bipolar Transistor), injector zones 30 can be present in the body zone material or injector zones 50 in the drift zone material. It is also of advantage if injector zones 30 and 50 are arranged both in the body zone material and in the drift zone material in an IGBT (Insulated Gate Bipolar Transistor).

A method for producing one of the above semiconductor devices 1 to 17 with semiconductor bodies 20 exhibits, e.g., the following method processes. Firstly, a highly doped semiconductor wafer is provided as substrate 52 as illustrated in FIG. 1, on which, if necessary, a second highly doped semiconductor zone 25 of the semiconductor body 20 can be provided. Onto the top side 53 of the substrate 52, an epitaxial layer is then applied for drift zones 26 which have a lesser impurity concentration than the substrate 52. Especially in the case of IGBTs, the semiconductor wafer can also form the drift zone 26 without epitaxial processes wherein the collector zone 25 doped complementarily to the drift zone 26 can also be produced, e.g., by using ion implantation.

Into this semiconductor body 20 formed in this manner, body zones 23 which are doped complementarily to the epitaxial layer are inserted from the top side 55. Into the body zones 23, injector zones 30 with complementary conduction to the body zones 23 are installed, e.g., by using ion implantation processes with sufficient implantation energy in combination with subsequent high-temperature processes. After it, highly doped first semiconductor zones 22, which are doped complementarily to the body zones, are then inserted into the body zone 23. Finally, contact windows 51 are still inserted in the first semiconductor zones 22 with access to the body zones 23.

These method processes can be carried out simultaneously for a multiplicity of semiconductor chips for the construction of semiconductor devices on the semiconductor wafer. In consequence, the insertion of injector zones 30 into the body zones 23 is made possible in these method processes. The insertion of trench gate electrodes 46 requires further method processes. For this purpose, trench structures 40 are inserted through the first highly doped semiconductor zones 22 and the body zones 23 with complementary doping for in each case one trench gate electrode 46. Following this, the trench walls 41 and the trench bottom 49 are coated with a gate oxide layer 28. Finally, the trench structures 40 are filled up with gate electrode material 42. This gate electrode material can be highly doped polycrystalline silicon which has electrically conductive characteristics.

Once the semiconductor wafer has been prepared in this manner, the individual semiconductor chips then have minority charge carrier injector zones 30 in the body zones, wherein the semiconductor body 20, for completion of the semiconductor device 1, after the filling-up of the trench structures 40 at the top side 55 is subjected to process steps for completing the semiconductor devices 1 on the rear side 54. It is only when all layers of metallization and layers of insulation have been patterned on the semiconductor wafer, that the semiconductor wafer can then be separated into individual semiconductor chips.

However, this does not yet conclude the production of the semiconductor device 1, instead, the semiconductor chips are applied to device carriers having a number of external contacts in a number of semiconductor component positions. After that, device electrodes of the semiconductor chips like the gate terminal G and the source terminal S are connected to a number of external contacts in a number of semiconductor component positions. After that, a semiconductor device package is still applied, the individual semiconductor chips and the connecting elements being embedded, for example, in a plastic material. Finally, the semiconductor device carrier is separated into individual semiconductor devices 1.

However, the insertion of minority charge carrier injector zones 50 as illustrated in FIGS. 14 and 15 can also be provided already for the drift zone material. In these cases, injector zones 50 doped complementarily to the substrate 52 are inserted in the top side 53 of the substrate 52 e.g., before an epitaxial layer is applied for drift zones 26. It is only then that the epitaxial layer for the drift zone 26 is grown on. This implements minority charge carrier injector zones 50 which, for example, are p-conducting and form a pn junction partially with the highly doped substrate 52, and thus with the second semiconductor area 25, and have a further pn junction to the drift zones 26. If a field stop zone is provided for the device, the dopant required for this purpose can be implanted, e.g., into the top side 53 of the substrate 52, particularly if a dopant is selected, the diffusion coefficient of which is distinctly higher than the diffusion coefficient of the dopant which determines the substrate doping and is diffused into the adjoining area of the drift zone in the subsequent high-temperature processes.

If such minority charge carrier injector zones 50 are to be arranged in the vicinity of the transition between the drift zones 26 and the highly doped substrate 52 as is illustrated in FIGS. 6 to 9 and FIGS. 16 and 17, the epitaxial growth can be interrupted, e.g., in order to arrange such injector zones 50 in the vicinity of the nn$^+$-transition to the highly doped substrate 52. This can take place in conjunction with the building up of an epitaxially applied pedestal zone 47 as illustrated in FIGS. 10 to 15. Such pedestal zones 47 have lower doping than the drift zone 26 so that, after applying the pedestal zone with low doping, an injector zone 50 can be inserted in the pedestal zone material. In this process, the pedestal zone 47 is provided with a distinctly lesser thickness than previously used pedestal zones between drift zone 23 and highly doped second semiconductor zone 25. However, for injector zones 50 which directly adjoin the substrate, it is also conceivable to insert the dopant required for this purpose into the top side 53 of the substrate 52, e.g., by using ion implantation, with the prerequisite that the diffusion constant of the dopant which forms the zones 50 is higher than the diffusion constant of the dopant which determines the substrate doping.

To insert such minority charge carrier injector zones 30 or 50 which have a complementary conduction with respect to the surrounding material, an ion implantation is first selectively performed at the locations at which the injector zones 30 or 50 are planned. Following this, a diffusion of the implanted impurities can be performed in order to distribute the inserted impurity material for the area of the minority charge carrier injector zones 30 or 50. Such an ion implantation method with subsequent diffusion of the implanted impurities can be provided both for the minority charge carrier injector zones 30 in the body zones 23 and for minority charge carrier injector zones 50 in the drift zones 26 or in the pedestal zone 47.

Thus the semiconductor device with a semiconductor body (20), exhibits a first electrodes (21) which contact first highly doped semiconductor zones (22) and complementary-conduction body zones (23) surrounding the first semiconductor zones (22) and a second electrode (24) which contacts a second highly doped semiconductor zone (25). A drift zone (26) is arranged between the body zones (23) and the second semiconductor zone (25) in the semiconductor body (20). Control electrodes (27) are insulated from the semiconductor body (20) by a gate oxide (28) and act on the body zones (23) for controlling the semiconductor device (1). Further, the body zones (23) exhibit minority charge carrier injector zones (30) with complementary conduction to the body zones (23), arranged between the first semiconductor zones (22) and the drift zone (26).

The injector zones (30) in the body zones (23) have top sides (29) which are oriented towards the first electrode (21) and have undersides (31) which are oriented towards the drift zone (25) in such a manner that they are surrounded by the material of the body zones (23). These injection zones (30) have an upper planar first pn junction (32) in the direction of the first electrode (21) and a lower planar second pn junction (33) in the direction of the drift zone (26) and the second electrode (24). Furthermore, the injector zones (30) are arranged to be island-shaped or strip-shaped or shaped like polygons in a normal or in a complementary doped manner.

On the other hand the body zones (23) have differently doped areas, wherein first body zone areas (34) which are contacted by the material of the first electrodes (21) are doped more highly than second body zone areas (35) surrounding them, which form the pn transitions (37) to the drift zone (26) and contact the gate oxide (28). In this case the injection zones (30) within the body zones (23) are arranged in such a manner that they are surrounded by the material of the second body zone area (35). These injection zones exhibit with their top sides (29) pn transitions (38) to the material of the first body zone areas (34) and with the undersides (31) pn transitions (33) to the material of the second body zone areas (35).

Further it is possible that the injection zones (30) exhibit with their top sides (29) pn transitions (39) to a third body zone area (36) which has a lower dopant concentration than the second body zone area (35) and which is arranged between the injection zones (30) and the first electrodes (21). Alternatively the body zones (23) are arranged in such a manner that their top sides (29) contact the first electrodes (21) and their undersides (31) exhibit a pn junction (33) with the second body zone area (35).

Care should be taken that the body zone area (35) below the underside (31) of the injection zones (30), the following relation:

$$fN_A dz \approx Q_{BR}$$

with $Q_{BR}$ is the breakdown charge of the semiconductor material. z is the spatial coordinate in the direction of the field strength and $N_A$ is the dopant concentration in the second body zone area (35) is met. The extent $w_v$ of the injector zone (30) in the vertical direction in micrometers exhibits between 0.5 µm $\leq w_v \leq$ 10 µm with an integrated dopant dose $C_D$ between:

$$1 \cdot 10^{12}\, cm^{-2} \leq C_D \leq 1 \cdot 10^{16}\, cm^{-2}.$$

or between $$5 \cdot 10^{12}\, cm^{-2} \leq C_D \leq 5 \cdot 10^{14}\, cm^{-2}$$

Further, the extent $w_1$ of the injector zones (30) in the lateral direction in micrometers exhibits between:

$$1\,\mu m \leq w_1 \leq 300\,\mu m.$$

or between:

$$10\,\mu m \leq w_1 \leq 200\,\mu m.$$

In a further embodiment the control electrodes (27) are arranged as trench gate electrodes in trench structures (40) wherein the trench walls (41) of the trench structures (40) exhibit a gate oxide (28) and a gate electrode material (42) at least in the area of the body zone (23). Below the gate electrode material (42) the trench structures (40) exhibit further electrodes (43). The minority charge carrier injector zones (50) with complementary doping to the drift zone (26) are arranged at the transition or in the vicinity of the transition of the drift zone (26) to the second semiconductor zone (25) that they form a pn junction (44, 45) both with the drift zone (26) and with the second semiconductor zone (25).

the extent $w_v$ of the injector zone (50) in the vertical direction in micrometers exhibits between:

$$0.1\,\mu m \leq w_v \leq 10\,\mu m$$

with an integrated dopant dose $C_D$ between:

$$1 \cdot 10^{12}\, cm^{-2} \leq C_D \leq 1 \cdot 10^{16}\, cm^{-2}$$

or between:

$$5 \cdot 10^{12}\, cm^{-2} \leq C_D \leq 5 \cdot 10^{14}\, cm^{-2}$$

It is possible that the injector zones (50) are arranged in a field stop zone or below the trench gate electrodes (46) in the drift zone (26) or offset to the trench gate electrodes (46).

A further embodiment includes a pedestal area (47) doped more weakly than the drift zone (26), of the same conduction type as the drift zone (26), which has minority charge carrier injector zones (50) of complementary conduction, is arranged between the drift zone (26) and the second semiconductor zone (24). In this case the minority charge carrier injector zones (50) are oriented in such a manner that they have within the weakly doped pedestal area (47) planar first pn junctions (44) in the direction of the first electrode (21) and planar second pn junctions (48) in the direction of the second electrode (24).

Further, the minority charge carrier injector zones (50) within the weakly doped pedestal area (47) are arranged in such a manner that they are surrounded by the material of the pedestal area (47) and form a pn junction (44, 45) both with the pedestal area (47) and with the second semiconductor zone (25). The minority charge carrier injector zones (50) in the pedestal area (47) can also be arranged below the trench gate electrodes (46) or offset to the trench gate electrodes (46).

The semiconductor device (1-19) can have as control electrodes (27) trench gate electrodes (46) which protrude into the drift zone (22), wherein further electrodes (43) are arranged in the trench structures (40) below the trench gate electrodes (46) and wherein minority charge carrier injector zones (50) with complementary conduction to the drift zone (26) are arranged in the drift zone material between the trench structure.

Further, the semiconductor device can be a compensation semiconductor device with charge compensation zones extending vertically and doped complementarily to the drift zone. The compensation zones in the drift zones are arranged to be column shaped or trench shaped. In this case the injector zones (50) are oriented in such a manner that they have within the drift zone material planar first pn junctions (44) on their top sides (29) in the direction of the trench structures (40) and planar second pn junctions (48) on their undersides (31) in the direction of the second electrode (24). The injector zones (50) can be surrounded by the drift zone material of the drift zone (26) or can be arranged below the trench structures (40) or can be arranged below and offset to the trench structures (40). Furthermore, it is possible that the injector zones (50) protrude into the second semiconductor zone (25) from the drift zone (26), and that the injector zones (50) have first pn junctions (44) with the material of the drift zone (26) and second pn junctions (45) with the material of the second semiconductor zone (25).

In an alternative embodiment the semiconductor device (1-17) has as control electrodes (27) trench gate electrodes (46) which protrude into the drift zone (26), wherein in the trench structures (40) of the trenches, further electrodes (43) are arranged below the trench gate electrodes (46) and wherein a weakly doped pedestal area (47) of the same type of conduction and having a weaker dopant concentration than the drift zone (26), which has minority charge carrier injector zones (50) with complementary conduction to the drift zone (26), is arranged between the drift zone (26) and the second semiconductor zones (43). The injector zones (50) are oriented in such a manner that they have, within the weakly doped pedestal area (47), planar first pn junctions (44) in the direction of the first electrodes (21) and planar second pn junctions (48) in the direction of the second electrode (24). There is the possibility to arrange the injector zones (50) within the weakly doped pedestal area (47) in such a manner that they are surrounded by the material of the pedestal area (47).

Furthermore the injector zones (50) in the weakly doped pedestal area (47) are arranged vertically below the trench structures (40) or laterally offset and below the trench structures (40). In this case the injector zones (50) protrude into the second semiconductor zone (25) from the pedestal area (47) and the injector zones (50) have first pn junctions (44) with the material of the weakly doped pedestal area (47) and second pn junctions (45) with the material of the second semiconductor zone (25).

This arrangement is applicable for semiconductor device like a power MOSFET which has injector zones (30) in the body zone material or injector zones (50) in the drift zone material. The invention can also be applied to a the semiconductor device like a power MOSFET which has injector zones (30, 50) both in the body zone material and in the drift zone material. The charge carrier compensation structures in the drift zone of the power MOSFET are formed by vertical field plates or by zones extending vertically and doped complementarily to the drift zone.

An embodiment relates to an IGBT (Insulated Gate Bipolar Transistor) which has injector zones (30) in the body zone material or in the drift zone material or in both, in the body zone material and in the drift zone material.

A method for producing a semiconductor device (1-17) with semiconductor body according to the previous embodiments exhibits the following method processes:

providing a highly doped semiconductor wafer as substrate for providing a second highly doped semiconductor zone (25) of the semiconductor body (20);

applying an epitaxial layer for drift zones (26) which have a lower impurity concentration than the substrate;

inserting body zones (23) which have complementary doping to the epitaxial layer;

inserting injector zones (30) with complementary conduction to the body zones (23) into the body zones (23);

inserting a highly doped first semiconductor zone (22) into the body zone (23);

inserting contact windows (51) into the first semiconductor zones (22) with access to the body zones (23).

Furthermore, this method can include the following additional method processes:

inserting trench structures (40) through the body zones (23) for at least trench gate electrodes (46);

coating the trench walls (41) and the trench bottom (49) with a gate oxide layer (28);

filling up the trench structure (40) with gate electrode material (42).

To accomplish this method it is necessary to insert injector zones (50) with complementary conduction to the substrate from the top side (53) of the substrate (52) before applying an epitaxial layer for drift zones (26). During the applying of an epitaxial layer for drift zones (26), injector zones (50) with complementary conduction to the drift zones (26) are inserted into the drift zone material close to the transition to the highly doped substrate (52). Also an epitaxial layer for a pedestal zone (47) can be applied which has a lower doping than the drift zone (26) before an epitaxial layer for drift zones (26) is grown.

Furthermore, an insertion of complementary-conduction injector zones (50) into the pedestal zone (47) can be applied before an epitaxial layer for drift zones is applied. Alternatively an insert of the complementary-conduction injector zones (50) by selective ion implantation followed by a diffusion of impurities can be carried out. Finally can be processed a filling up of the trench structure (40) on the top side (53) and the rear side (54) of the semiconductor wafer and method processes for completing the semiconductor devices (1-17) are carried out and the semiconductor wafer is separated into individual semiconductor chips.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device with a semiconductor body, comprising:

first electrodes which contact first highly doped semiconductor zones and complementary-conduction body zones surrounding the first semiconductor zones;

a second electrode which contacts a second highly doped semiconductor zone;

a drift zone which is arranged between the body zones and the second semiconductor zone in the semiconductor body;

control electrodes which are insulated from the semiconductor body by a gate oxide and act on the body zones for controlling the semiconductor device; and minority charge carrier injector zones situated within the body zones with complementary conduction to the body zones, arranged between the first semiconductor zones and the drift zone.

2. The semiconductor device of claim 1, wherein the injection zones are oriented within the body zones in such a manner that they have an upper planar first pn junction in the direction of the first electrode and a lower planar second pn junction in the direction of the drift zone and the second electrode.

3. The semiconductor device of claim 1, wherein the injector zones are arranged in manner that they are surrounded by the material of the body zones or that they are island-shaped or strip-shaped or are shaped as polygons in a normal doped manner or a complementary doped manner.

4. The semiconductor device of claim 1, wherein the body zones have differently doped areas, wherein first body zone areas which are contacted by the material of the first electrodes are doped more highly than second body zone areas surrounding them, which form the pn transitions to the drift zone and contact the gate oxide.

5. The semiconductor device of claim 4, wherein the injection zones within the body zones are configured such that they are surrounded by the material of the second body zone area or that the injection zones exhibit with their top sides pn transitions to the material of the first body zone areas (and with the undersides pn transitions to the material of the second body zone areas or that the injection zones exhibit with their top sides pn transitions to a third body zone area which has a lower dopant concentration than the second body zone area and which is arranged between the injection zones and the first electrodes or that the injection zones within the body zones are arranged in such a manner that their top sides contact the first electrodes and their undersides exhibit a pn junction with the second body zone area.

6. The semiconductor device of claim 1, wherein, for the body zone area below the underside of the injection zones, the following relation:

$$\int N_A dz \approx Q_{BR}$$

with $Q_{BR}$ breakdown charge of the semiconductor material, z spatial coordinate in the direction of the field strength and $N_A$ dopant concentration in the second body zone area is met.

7. The semiconductor device of claim 1, wherein the extent $w_v$ of the injector zone in the vertical direction in micrometers exhibits between $0.5\ \mu m \leq w_v \leq 10\ \mu m$ with an integrated dopant dose $C_D$ between $1\cdot 10^{12}\ cm^{-2} \leq C_D \leq 1\cdot 10^{16}\ cm^{-2}$ or between $5\cdot 10^{12}\ cm^{-2} \leq C_D \leq 5\cdot 10^{14}\ cm^{-2}$.

8. The semiconductor device of claim 1, wherein the extent $w_1$ of the injector zones in the lateral direction in micrometers exhibits between $1\ \mu m \leq w_1 \leq 300\ \mu m$ or between $10\ \mu m \leq w_1 \leq 200\ \mu m$.

9. The semiconductor device of claim 1, wherein the control electrodes are arranged as trench gate electrodes in trench structures, wherein the trench walls of the trench structures exhibit a gate oxide and a gate electrode material at least in the area of the body zone and wherein the trench structures exhibit further electrodes below the gate electrode material.

10. The semiconductor device of claim 1, wherein minority charge carrier injector zones with complementary doping to the drift zone are arranged at the transition or in the vicinity of the transition of the drift zone to the second semiconductor zone or they are arranged in such a manner that they form a pn junction both with the drift zone and with the second semiconductor zone, wherein the extent $w_v$ of the injector zone in the vertical direction in micrometers exhibits between 0.1 $\mu m \leq w_v \leq 10$ $\mu m$ with an integrated dopant dose $C_D$ between $1 \cdot 10^{12}$ cm$^{-2} \leq C_D \leq 1 \cdot 10^{16}$ cm$^{-2}$ or between $5 \cdot 10^{12}$ cm$^{-2} \leq C_D \leq 5 \cdot 10^{14}$ cm$^{-2}$.

11. The semiconductor device of claim 1, wherein the injector zones are arranged in a field stop zone or below the trench gate electrodes in the drift zone or offset to the trench gate electrodes.

12. The semiconductor of claim 1, wherein the semiconductor device has as control electrodes trench gate electrodes which protrude into the drift zone, wherein further electrodes are arranged in the trench structures below the trench gate electrodes and wherein minority charge carrier injector zones with complementary conduction to the drift zone are arranged in the drift zone material between the trench structure and the second semiconductor zones.

13. The semiconductor device of claim 1, wherein the semiconductor device is a compensation semiconductor device with charge compensation zones extending vertically and doped complementarily to the drift zone, and wherein the charge compensation zones in the drift zones are arranged to be column shaped or trench shaped.

14. The semiconductor device of claim 1, wherein the semiconductor device has as control electrodes trench gate electrodes which protrude into the drift zone, wherein in the trench structures of the trenches, further electrodes are arranged below the trench gate electrodes and wherein a weakly doped pedestal area of the same type of conduction and having a weaker dopant concentration than the drift zone, which has minority charge carrier injector zones with complementary conduction to the drift zone, is arranged between the drift zone and the second semiconductor zones, wherein the injector zones are oriented in such a manner that they have, within the weakly doped pedestal area, planar first pn junctions in the direction of the first electrodes and planar second pn junctions in the direction of the second electrode.

15. The semiconductor device of claim 14, wherein the injector zones within the weakly doped pedestal area are arranged in such a manner that they are surrounded by the material of the pedestal area or are arranged vertically below the trench structures or are arranged laterally offset and below the trench structures.

16. The semiconductor device of claim 15, wherein the injector zones protrude into the second semiconductor zone from the pedestal area and wherein the injector zones have first pn junctions with the material of the weakly doped pedestal area and second pn junctions with the material of the second semiconductor zone.

17. The semiconductor device of claim 14, wherein charge carrier compensation structures in the drift zone of the power MOSFET are formed by vertical field plates or by zones extending vertically and doped complementarily to the drift zone.

18. The semiconductor device of claim 1, wherein the semiconductor device is a power MOSFET and has injector zones in the body zone material or injector zones in the drift zone material or has injector zones both in the body zone material and in the drift zone material.

19. A semiconductor device with a semiconductor body, comprising:
first electrodes which contact first highly doped semiconductor zones and complementary-conduction body zones surrounding the first semiconductor zones;
a second electrode which contacts a second highly doped semiconductor zone;
a drift zone which is arranged between the body zones and the second semiconductor zone in the semiconductor body;
control electrodes which are insulated from the semiconductor body by a gate oxide and act on the body zones for controlling the semiconductor device;
minority charge carrier injector zones situated within the body zones with complementary conduction to the body zones, arranged between the first semiconductor zones and the drift zone; and
wherein a pedestal area doped more weakly than the drift zone, of the same conduction type as the drift zone, which has minority charge carrier injector zones of complementary conduction, is arranged between the drift zone and the second semiconductor zone.

20. The semiconductor of claim 19, wherein the minority charge carrier injector zones are oriented in such a manner that they have within the weakly doped pedestal area planar first pn junctions in the direction of the first electrode and planar second pn junctions in the direction of the second electrode, wherein the minority charge carrier injector zones within the weakly doped pedestal area are arranged in such a manner that they are surrounded by the material of the pedestal area or that they form a pn junction both with the pedestal area and with the second semiconductor zone or that they are arranged offset to the trench gate electrodes.

21. A semiconductor device with a semiconductor body, comprising:
first electrodes which contact first highly doped semiconductor zones and complementary-conduction body zones surrounding the first semiconductor zones;
a second electrode which contacts a second highly doped semiconductor zone;
a drift zone which is arranged between the body zones and the second semiconductor zone in the semiconductor body;
control electrodes which are insulated from the semiconductor body by a gate oxide and act on the body zones for controlling the semiconductor device;
wherein the body zones comprise minority charge carrier injector zones with complementary conduction to the body zones, arranged between the first semiconductor zones and the drift zone; and
wherein the injector zones are oriented in such a manner that they have within the drift zone material planar first pn junctions on their top sides in the direction of the trench structures and planar second pn junctions on their undersides in the direction of the second electrode, and wherein the injector zones are surrounded by the drift zone material of the drift zone or are arranged below the trench structures or are arranged below and offset to the trench structures.

22. The semiconductor device of claim 21, wherein the injector zones protrude into the second semiconductor zone from the drift zone, and wherein the injector zones have first pn junctions with the material of the drift zone and second pn junctions with the material of the second semiconductor zone.

23. The semiconductor device of claim 1, wherein the body zone comprises doping material for p-conducting regions in Si which exhibits at least an energy level of 70 mev above the valence band border like Ga or In or wherein the low doped pedestal area comprises doping material for n-conducting regions in Si which exhibits an energy level of at least 150 mev below the conduction band border like S or Se.

24. A method of making a semiconductor device with a semiconductor body according to claim 1, comprising contacting first electrodes with first highly doped semiconductor zones and complementary-conduction body zones surrounding the first semiconductor zones;

contacting a second electrode with a second highly doped semiconductor zone;

arranging a drift zone between the body zones and the second semiconductor zone in the semiconductor body;

insulating control electrodes from the semiconductor body by a gate oxide and act on the body zones for controlling the semiconductor device; and wherein the body zones comprise minority charge carrier injector zones with complementary conduction to the body zones, arranged between the first semiconductor zones and the drift zone.

\* \* \* \* \*